(12) United States Patent
Itoh et al.

(10) Patent No.: US 10,018,776 B2
(45) Date of Patent: Jul. 10, 2018

(54) ILLUMINATION DEVICE, ILLUMINATION EQUIPMENT, AND DISPLAY DEVICE

(71) Applicant: Sharp Kabushiki Kaisha, Osaka-shi, Osaka (JP)

(72) Inventors: Masayuki Itoh, Osaka (JP); Hiroshi Umeda, Osaka (JP); Kazuo Tamaki, Osaka (JP); Masanobu Okano, Osaka (JP); Yusuke Shibata, Osaka (JP); Manabu Onozaki, Osaka (JP); Atsushi Yamashita, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 395 days.

(21) Appl. No.: 14/783,527

(22) PCT Filed: Apr. 10, 2014

(86) PCT No.: PCT/JP2014/060413
§ 371 (c)(1),
(2) Date: Oct. 9, 2015

(87) PCT Pub. No.: WO2014/171394
PCT Pub. Date: Oct. 23, 2014

(65) Prior Publication Data
US 2016/0062023 A1 Mar. 3, 2016

(30) Foreign Application Priority Data

Apr. 15, 2013 (JP) .................................. 2013-085294
Nov. 18, 2013 (JP) .................................. 2013-238220

(51) Int. Cl.
*F21V 8/00* (2006.01)
*H01L 25/075* (2006.01)
(Continued)

(52) U.S. Cl.
CPC ........... *G02B 6/009* (2013.01); *G02B 6/0026* (2013.01); *G02B 6/0068* (2013.01);
(Continued)

(58) Field of Classification Search
CPC .... G02B 6/009; G02B 6/0068; G02B 6/0073; G02B 6/0026
See application file for complete search history.

(56) References Cited

U.S. PATENT DOCUMENTS

2005/0127816 A1  6/2005 Sumitani
2006/0043879 A1  3/2006 Naitou
(Continued)

FOREIGN PATENT DOCUMENTS

JP  2004-342472 A  12/2004
JP  2005-203748 A   7/2005
(Continued)

OTHER PUBLICATIONS

Official Communication issued in International Patent Application No. PCT/JP2014/060413, dated Jul. 8, 2014.

*Primary Examiner* — Thomas M Sember
(74) *Attorney, Agent, or Firm* — Keating & Bennett, LLP

(57) ABSTRACT

An illumination device (11) includes a light guide plate (15) and a light source unit (10) which includes a substrate (12) and a plurality of LED chips (16) disposed on the substrate (12), and which is disposed in a position at which emitted light of the LED chips (16) enters a light entrance portion (15a) of the light guide plate (15). The LED chips (16) are disposed to form a plurality of rows on the substrate (12), and are disposed to line up in a direction which orthogonally intersects the rows between each of the rows.

21 Claims, 30 Drawing Sheets

(51) Int. Cl.
 *F21Y 105/00* (2016.01)
 *F21Y 115/10* (2016.01)

(52) U.S. Cl.
 CPC ........ *G02B 6/0073* (2013.01); *F21Y 2105/00* (2013.01); *F21Y 2115/10* (2016.08); *H01L 25/0753* (2013.01); *H01L 2924/0002* (2013.01)

(56) References Cited

U.S. PATENT DOCUMENTS

| | | |
|---|---|---|
| 2006/0226759 A1 | 10/2006 | Masuda et al. |
| 2007/0242474 A1 | 10/2007 | Kim |
| 2007/0253218 A1 | 11/2007 | Tanabe |
| 2009/0097240 A1 | 4/2009 | Egawa |
| 2009/0316072 A1 | 12/2009 | Okumura et al. |
| 2011/0085352 A1 | 4/2011 | Ito et al. |
| 2015/0016088 A1 | 1/2015 | Shiraichi et al. |

FOREIGN PATENT DOCUMENTS

| | | |
|---|---|---|
| JP | 2006-073656 A | 3/2006 |
| JP | 2007-049114 A | 2/2007 |
| JP | 2007-122950 A | 5/2007 |
| JP | 2007-287692 A | 11/2007 |
| JP | 2007-335323 A | 12/2007 |
| JP | 2009-099334 A | 5/2009 |
| JP | 2009-245902 A | 10/2009 |
| JP | 2010-15709 A | 1/2010 |
| JP | 4455598 B2 | 4/2010 |
| JP | 2011-228538 A | 11/2011 |
| JP | 2012-028339 A | 2/2012 |
| JP | 2012-186070 A | 9/2012 |
| JP | 2013-8503 A | 1/2013 |
| JP | 5263722 B2 | 8/2013 |
| JP | 2013-171686 A | 9/2013 |
| JP | 2013-171687 A | 9/2013 |
| WO | 2009/145298 A1 | 12/2009 |
| WO | 2012/124509 A1 | 9/2012 |

F I G. 2
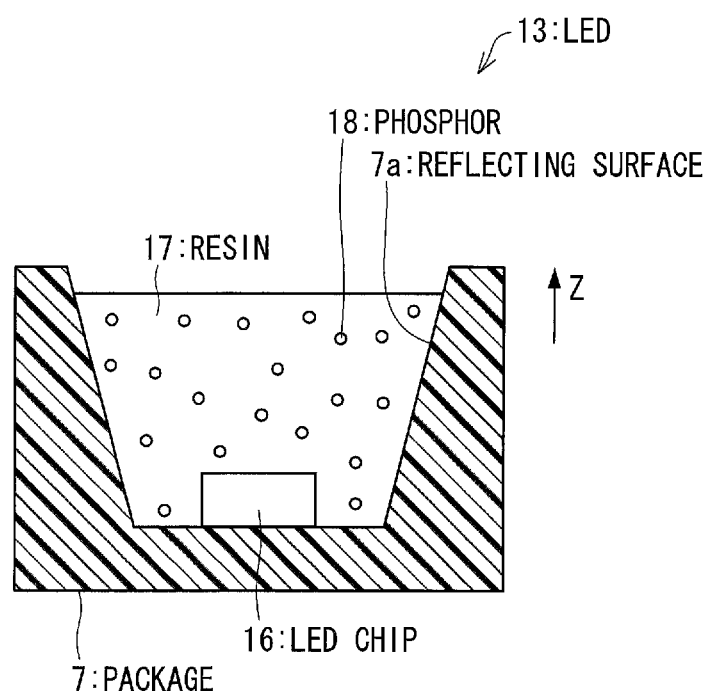

F I G. 3
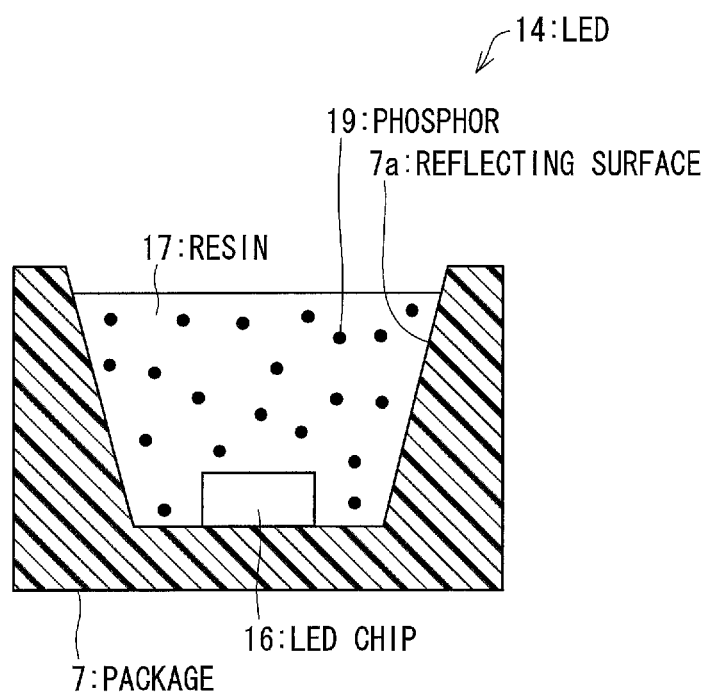

F I G. 2 5
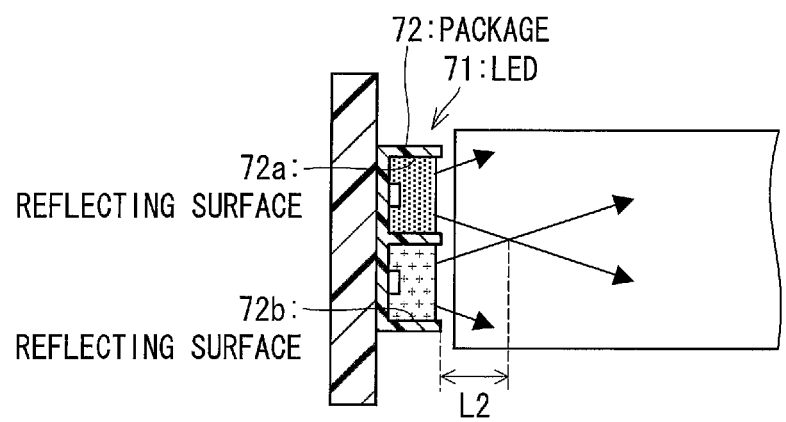

ILLUMINATION DEVICE, ILLUMINATION EQUIPMENT, AND DISPLAY DEVICE

TECHNICAL FIELD

The present invention relates to an illumination device which emits light from a light source including a plurality of LEDs in a planar shape using a light guide plate, and to an illumination equipment and a display device which are provided with the illumination device.

BACKGROUND ART

In recent years, LEDs, which have a long life and a small power consumption, have come into common use as backlights of liquid crystal display devices and light sources of illumination equipment. In such a light source, a desired luminescent color is obtained by combining LEDs of a plurality of different luminescent colors, by combining monochromatic LEDs and a phosphor, or the like. For example, a white LED is generally formed by combining a blue LED with a phosphor. In such a white LED, white light is obtained by combining the colors of the blue light which is emitted from the blue LED chip and the light which is emitted due to the phosphor being excited by the blue light.

A direct backlight or an edge light backlight is applied in order to use such a white LED in a backlight. In the direct backlight, each white LED radiates direct light onto the rear surface of a liquid crystal panel. Meanwhile, in the edge light backlight, the light of white LEDs is incident from the side end portion of a light guide plate, the light is emitted from the exit surface of the light guide plate, and is radiated onto the rear surface of the liquid crystal panel.

Of these, in the edge light backlight, since, ordinarily, the plurality of white LEDs is disposed on the side end portion of the light guide plate, it is easy to reduce the thickness. Therefore, for example, in order to simplify the embedding of white LEDs in a liquid crystal display device, the white LEDs are installed in a state of being disposed in a straight line along the side end portion of the light guide plate, and are provided as a straight line shaped light source (for example, PTL 1 and 2).

There is an illumination equipment in which the light from multiple LEDs is converted into planar light by a light guide plate and radiated in order to illuminate a comparatively wide space, as in a ceiling light. In such illumination equipment, a light source in which a plurality of LEDs is disposed to line up in a straight line on a substrate is provided so as to allow the light from the LEDs to enter a light entrance portion of the light guide plate (for example, PTL 3). In such illumination equipment, although illumination light of a desired color is obtained by mixing the colors of light from LEDs of a plurality of different luminescent colors, there is an illumination equipment which has a function of adjusting the color of the illumination light by adjusting the luminescent color of each of the LEDs.

CITATION LIST

Patent Literature

PTL 1: Japanese Unexamined Patent Application Publication No. 2009-245902 (published on Oct. 22, 2009)
PTL 2: Japanese Unexamined Patent Application Publication No. 2012-186070 (published on Sep. 27, 2012)
PTL 3: Japanese Unexamined Patent Application Publication No. 2009-99334 (published on May 7, 2009)
PTL 4: Japanese Unexamined Patent Application Publication No. 2013-171686 (published on Sep. 2, 2013)
PTL 5: Japanese Unexamined Patent Application Publication No. 2013-171687 (published on Sep. 2, 2013)
PTL 6: Japanese Unexamined Patent Application Publication No. 2007-49114 (published on Feb. 22, 2007)
PTL 7: Japanese Patent No. 5263722 (published on Aug. 14, 2013)

SUMMARY OF INVENTION

Technical Problem

The light source which is used in the related art described above is ordinarily configured by a plurality of LEDs being disposed in a single straight line. FIGS. 21 to 24 illustrate configurations of illumination devices of the related art which have such light sources.

In an illumination device 201 illustrated in FIGS. 21 (a) and (b), a plurality of LEDs 203 and 204 which have different luminescent colors are installed on a substrate 202 which is formed long and thin. The LEDs 203 and 204 are disposed alternately to line up in one row.

According to the illumination device 201, when the emitted light from each of the LEDs 203 and 204 enters a light guide plate 205, the colors do not mix with each other in regions B1 and B2 which are in front of the respective LEDs 203 and 204, and the colors mix in more distal regions. Therefore, even if the non-mixed light is emitted from the light guide plate 205, it is not possible to use the light.

Therefore, when the illumination device 201 is used as a backlight of a liquid crystal display device, there is an inconvenience in that in order to allow only the emission of the mixed-color light, a frame portion of the liquid crystal display device for covering the range of a width D1 from the light entrance portion of the light guide plate 205 must be formed to be large. Even when the illumination device 201 is used in the illumination equipment, there is an inconvenience in that the size of the illumination equipment is increased in order to hide the portion in which the colors are not mixed, and constraints arise in the design.

In contrast, in an illumination device 211 illustrated in FIGS. 22 (a) and (b), a plurality of LEDs 212 in which two LED chips are mounted within a single package is installed on the substrate 202. It is possible to treat the LED 212 as an LED in which the LEDs 203 and 204 described earlier are converted into a single package. Therefore, lights of two different colors which are the same as the lights from the LEDs 203 and 204 are emitted from the LED 212.

According to the illumination device 211, when the two emitted light beams from the LED 212 enter the light guide plate 205, a portion is color mixed in front of the LED 212. However, the emitted light other than the portion which is color mixed does not mix colors in regions B3 and B4 until mixing colors with the emitted light from the adjacent LED 212. Therefore, according to the illumination device 211, it is possible to narrow the width of the range over which the light guide plate 205 is to be covered from the light entrance portion to a width D2 (D2<D1). However, even in the illumination device 211, this is insufficient to reduce the size of the region in which non-mixed color light is emitted in the light guide plate 205.

Meanwhile, in an illumination device 221 illustrated in FIGS. 23 (a) and (b), a plurality of LEDs 222 with the same luminescent color is installed on the substrate 202 so as to line up in a row. One LED chip is mounted in each of the LEDs 222.

In the illumination device 221, although it is not necessary to consider the color mixing properties as in the illumination devices 201 and 211, there is an inconvenience in that the amount of light incident on the light guide plate 205 is small. Therefore, when using the illumination device 221 as the backlight of a liquid crystal display device, there is a concern that the luminance will drop due to an insufficient light amount of the emitted light.

In contrast, in an illumination device 231 illustrated in FIGS. 24 (a) and (b), a plurality of LEDs 232 with the same luminescent color, each of which having two LED chips, is installed on the substrate 202 so as to line up in a row.

In the illumination device 231, since two LED chips in the LED 232 are lined up in the arrangement direction of the LEDs 232, the amount of light incident on the light guide plate 205 increases in comparison to the illumination device 221. However, since mutual absorption of the light occurs between the two LED chips which are lined up in the LED 232, the luminous efficiency drops.

The mutual absorption is a phenomenon in which the light which is emitted from one LED chip is absorbed by the other LED chip which is adjacent thereto due to the absorption of light when transitioning between bands in an excited state of a conduction band when electrons which are in the ground state of the valence band absorb incident light.

The present invention was made in consideration of the problems described above, and an object thereof is to provide an illumination device capable of obtaining an improvement in color mixing properties and an increase in emitted light amount.

Solution to Problem

In order to solve the problems described above, the illumination device according to an aspect of the present invention includes a light guide plate, and a light source unit which includes a substrate and a plurality of LED chips disposed on the substrate, and which is disposed such that emitted light of the LED chips enters a light entrance portion of the light guide plate, in which the LED chips are disposed to form a plurality of rows on the substrate, and are disposed to line up in a direction orthogonally intersecting the rows between each of the rows.

Advantageous Effects of Invention

According to the aspect of the present invention, an effect is achieved in that it is possible to obtain an improvement in color mixing properties and an increase in an emitted light amount.

BRIEF DESCRIPTION OF DRAWINGS

FIG. 2 is a longitudinal sectional diagram of an LED in the illumination device.

FIG. 3 is a longitudinal sectional diagram of another LED in the illumination device with a different luminescent color from the LED described above.

FIG. 25 is a longitudinal sectional diagram of an illumination device of a comparative example of the first embodiment.

DESCRIPTION OF EMBODIMENTS

Hereinafter, embodiments of the present invention will be described in detail.

First Embodiment

Description will be given of the first embodiment of the present invention, with reference to FIGS. 1 to 4.
[Configuration of Illumination Device 11]
FIG. 1 (a) is a plan view illustrating a portion of a light source unit 10 in an illumination device 11 according to the first embodiment in an enlarged manner, and FIG. 1 (b) is a longitudinal sectional diagram of the illumination device 11.

Figure 1:
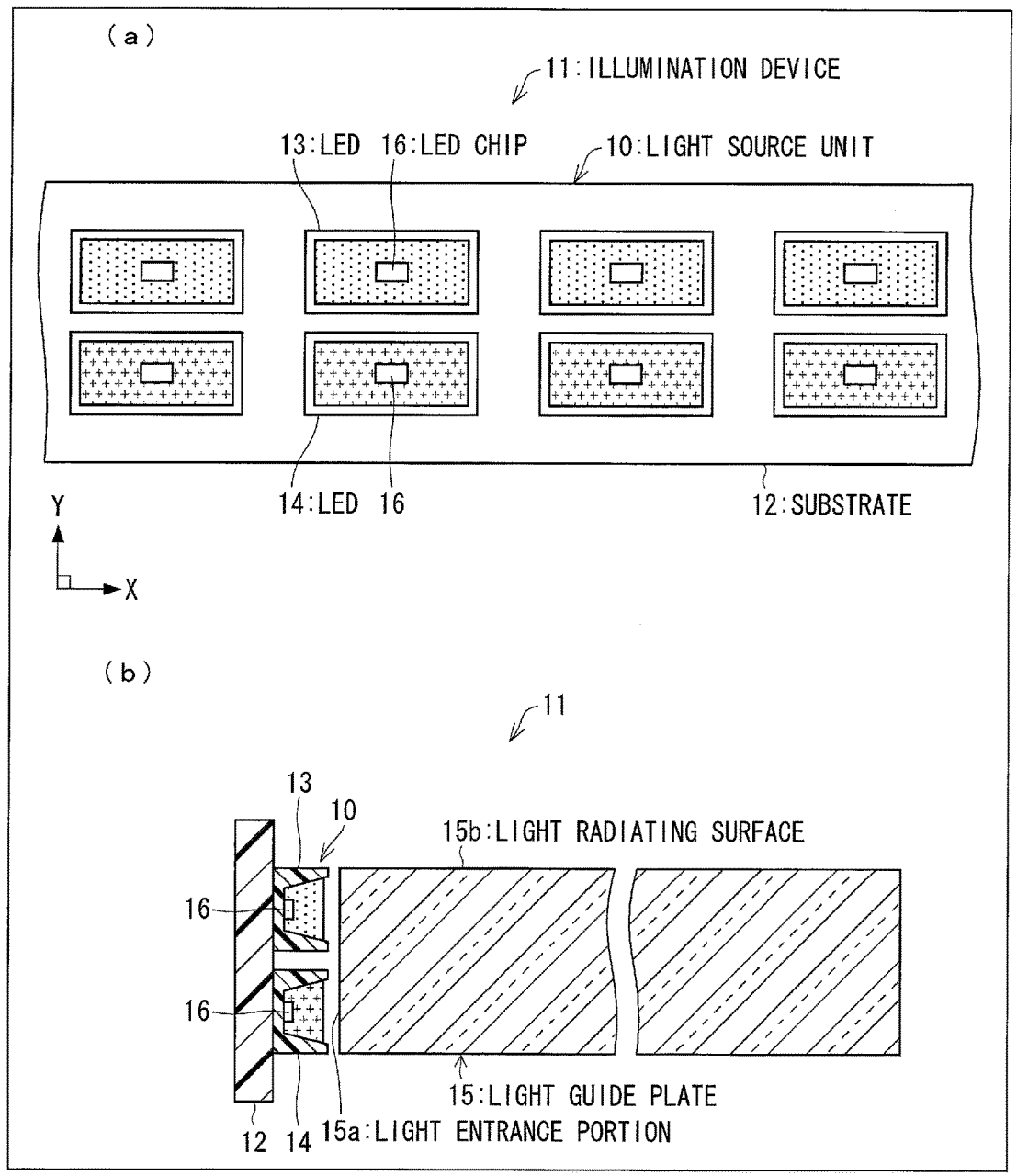
FIG. 1 (a) is a plan view illustrating a portion of a light source unit in an illumination device according to a first embodiment of the present invention in an enlarged manner, and FIG. 1 (b) is a longitudinal sectional diagram of the illumination device.

As illustrated in FIGS. 1 (a) and 1 (b), the illumination device 11 is provided with a substrate 12, a plurality of LEDs 13 and 14, and a light guide plate 15.

The light guide plate 15 is formed such that the entirety thereof is rectangular, and is a transparent member with a predetermined thickness. The light guide plate 15 has a structure capable of extracting light from the various parts of a light radiating surface 15b so as to radiate the light which is incident from a light entrance portion 15a in a planar manner, and is formed of a transparent material such as acrylic. The end surface of one side of the light guide plate 15 functions as the light entrance portion 15a onto which the light is incident.

The substrate 12 is formed to be an elongated rectangle shape (rectangular), and has enough width that it is possible to dispose the LEDs 13 and 14 to line up in the width direction of the substrate 12. In the substrate 12, printed wiring (not shown) for supplying power to the LEDs 13 and 14 is formed on an installation surface to which the LEDs 13 and 14 are installed. A positive terminal and a negative terminal (not shown) which are connected to the printed wiring are formed on both end portions or one end portion of the substrate 12. Power is supplied to the LEDs 13 and 14 due to a wiring for supplying power from outside being connected to the positive terminal and the negative terminal.

A plurality of the LEDs 13 and 14 is installed on the substrate 12 so as to line up in two rows along the longitudinal direction of the substrate 12, where one row is formed by the LEDs 13 and the other row is formed by the LEDs 14. The LEDs 13 and 14 are connected electrically in series, respectively. In the LEDs 13 and 14, between adjacent rows, respective LED chips 16 are disposed leaving an interval so as to line up in a direction (a Y direction) orthogonally intersecting the row direction (an X direction), that is, the thickness direction of the light guide plate 15 (the width direction of the light entrance portion 15a).

The substrate 12 and the LEDs 13 and 14 form the light source unit 10. The light emitting surfaces of the LEDs 13 and 14 face the light entrance portion 15a, and the light source unit 10 is disposed in a position in the vicinity of the light guide plate 15 such that the emitted light from the respective LED chips 16 of the LEDs 13 and 14 enters the light entrance portion 15a of the light guide plate 15.
[Configuration of LEDs 13 and 14]
FIG. 2 is a longitudinal sectional diagram of the LED 13 in the illumination device 11. FIG. 3 is a longitudinal sectional diagram of the other LED 14 in the illumination device 11 with a different luminescent color from the LED 13.

As illustrated in FIG. 1 (a), in the LED 13 or 14, the light emitting surface is rectangular, and the LED chip 16 is installed in the center. As illustrated in FIG. 2, the LED 13 includes a package 7, the LED chip 16, a resin 17, and a phosphor 18.

The package 7 includes a concave surface portion which is the shape of a mortar which widens from the bottom surface to the opening. The LED chip 16 is installed on the bottom surface of the concave surface portion. The concave surface portion forms a space (a concave portion) for filling with the resin 17. The package 7 is formed of a nylon-based material, and is provided using insert molding such that a lead frame (not shown) is exposed to the bottom surface of the concave surface portion. The lead frame is divided into two at the exposed portion.

The package 7 includes a reflecting surface 7a which forms the side surface of the concave surface portion. It is preferable that the reflecting surface 7a is formed of a metal film containing Ag or Al, or white silicone which have a high reflectance such that the emitted light from the LED chip 16 is reflected to the outside of the LED 13. The reflecting surface 7a is formed to be inclined in relation to light which proceeds straight in the Z direction directly in front of the emission among the light which is emitted from the LED chip 16, that is, light with an emission angle of 0°.

The LED chip 16 (an LED element) is, for example, a GaN-based semiconductor light emitting element which has a conductive substrate, and, although not depicted in the drawings, a bottom surface electrode is formed on the bottom surface of the conductive substrate, and a top portion electrode is formed on the opposite surface. The emitted light (primary light) of the LED chip 16 is blue light in the range of 430 to 480 nm, and has a peak wavelength in the vicinity of 450 nm.

The LED chip 16 (the blue LED chip) is die bonded using a conductive solder on one side of the exposed portion in the lead frame described above. In the LED chip 16, the top portion electrode of the LED chip 16 is wire bonded to the other side in the lead frame from the exposed portion using a wire (not shown). In this manner, the LED chip 16 is electrically connected to the lead frame. Here, although description is given of an LED chip of a type in which there are electrodes on the top surface and the bottom surface, an LED of a type which has two electrodes on the top surface may also be used.

The resin 17 seals the concave portion in which the LED chip 16 is disposed by filling the inside of the concave portion. Since a high durability in relation to the primary light which has a short wavelength is demanded of the resin 17, a silicone resin is used favorably. The surface of the resin 17 forms a light emitting surface from which light is emitted.

The phosphor 18 (the red phosphor) is dispersed in the resin 17. The phosphor 18 is a red phosphor which emits a secondary light of a longer wavelength of red (a peak wavelength from 600 nm to 780 nm) than the primary light, and, for example, is formed of a phosphor material obtained by mixing $CaAlSiN_3$:Eu, or a phosphor material (KSF) obtained by mixing $K_2SiF_6$:Mn.

In the LED 13 which is configured as described above, as the primary light (the blue light) which is emitted from the LED chip 16 passes through the resin 17, a portion of the primary light excites the phosphor 18 and is converted into the secondary light (the red light). In this manner, magenta light is radiated from the LED 13 to the outside due to the color mixing of the blue primary light and the red secondary light.

As illustrated in FIG. 3, in the same manner as the LED 13, the LED 14 includes the package 7, the LED chip 16, and the resin 17; however, instead of the phosphor 18, the LED 14 includes a phosphor 19.

The phosphor 19 (the green phosphor) is dispersed in the resin 17 in the same manner as the phosphor 19. The phosphor 19 is a green phosphor which emits secondary light of a longer wavelength of green (a peak wavelength from 500 nm to 550 nm) than the primary light, and, for example, is formed of a phosphor material of Eu-doped β SiAlON.

In the LED 14 which is configured as described above, as the primary light (the blue light) which is emitted from the LED chip 16 passes through the resin 17, a portion of the primary light excites the phosphor 19 and is converted into the secondary light (the green light). In this manner, cyan light is radiated from the LED 14 to the outside due to the color mixing of the blue primary light and the green secondary light.

Therefore, due to the LEDs 13 and 14 which are configured as described above being installed in the light source unit 10, the light source unit 10 radiates white light due to the mixing of the magenta light from the LED 13 and the cyan light from the LED 14.

[Configuration of LED Drive Control Unit 1]

Figure 4:
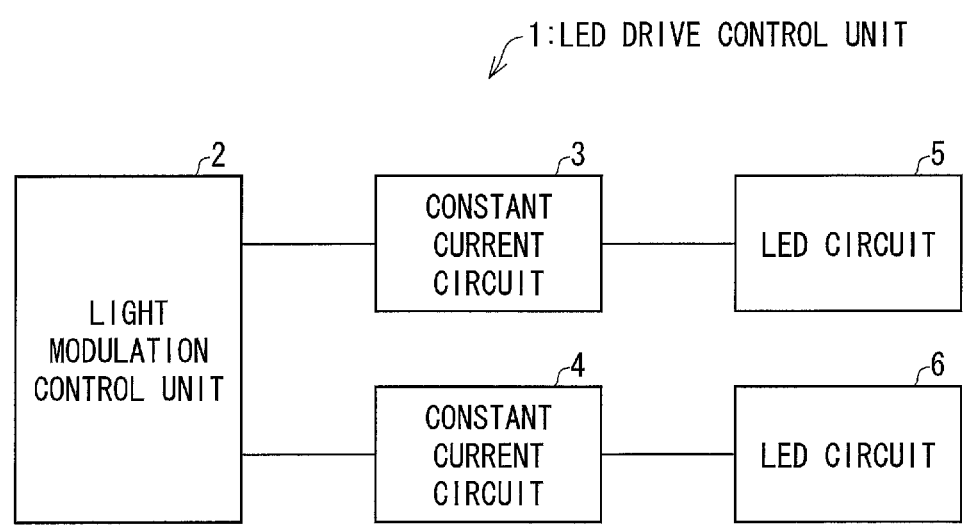
FIG. 4 is a block diagram illustrating the configuration of an LED drive control unit which controls the driving of the LEDs in the illumination device according to each embodiment of the present invention.

FIG. 4 is a block diagram illustrating the configuration of the LED drive control unit 1 which controls the driving of the LEDs 13 and 14.

As illustrated in FIG. 4, the LED drive control unit 1 includes a light modulation control unit 2, constant current circuits 3 and 4, and LED circuits 5 and 6. The LED circuit 5 is a series circuit of the LEDs 13 which are installed on the substrate 12. The LED circuit 6 is a series circuit of the LEDs 14 which are installed on the substrate 12.

The light modulation control unit 2 individually controls the LEDs 13 and 14 in the LED circuits 5 and 6, respectively, using PWM control. Therefore, the light modulation control unit 2 includes a PWM circuit (not shown) which individually generates the PWM signals which are applied to the LED circuits 5 and 6. The PWM circuit changes the duty cycle of the PWM signal according to instructions from outside.

The constant current circuit 3 generates a constant current which flows in the LED circuit 5 based on the PWM signal which is supplied from the light modulation control unit 2. While the constant current circuit 3 turns on during the period of the H level of the PWM signal to allow a constant current to flow, the constant current circuit 3 turns off during the period of the L level of the PWM signal to not allow the constant current to flow.

Meanwhile, the constant current circuit 4 generates a constant current which flows in the LED circuit 6 based on the PWM signal which is supplied from the light modulation control unit 2. While the constant current circuit 4 turns on during the period of the H level of the PWM signal to allow a constant current to flow, the constant current circuit 4 turns off during the period of the L level of the PWM signal to not allow the constant current to flow.

In the LED drive control unit 1 which is configured as described above, using the PWM signals which are individually controlled by the light modulation control unit 2, the constant current which is allowed to flow in the LED circuit 5 by the constant current circuit 3 is controlled, and the constant current which is allowed to flow in the LED circuit 6 by the constant current circuit 4 is controlled. Accordingly, the light intensity of the LEDs 13 and 14 is controlled individually. Therefore, the light source unit 10 is capable of irradiating the light guide plate 15 with mixed-color light of a different color according to the light intensities of the LEDs 13 and 14 by adjusting the constant currents which are allowed to flow in the LED circuits 5 and 6, respectively.

[Effects of Illumination Device 11]

As described above, the illumination device 11 of the present embodiment is provided with the light source unit 10 in which the LEDs 13 and 14 of different luminescent colors are installed on the substrate 12 to form respective rows. In the light source unit 10, the LEDs 13 and 14 are disposed such that, between each of the rows, the LED chips 16 line up in a direction (the Y direction) which orthogonally intersects the row direction (the X direction). In this manner, since the LED chips 16 which are the light emission points of the LEDs 13 and 14 are lined up in the direction which orthogonally intersects the row, the color mixing properties of the emitted light from each of the LEDs 13 and 14 are improved due to the two light emission points being in the vicinity of each other.

Figure 21:
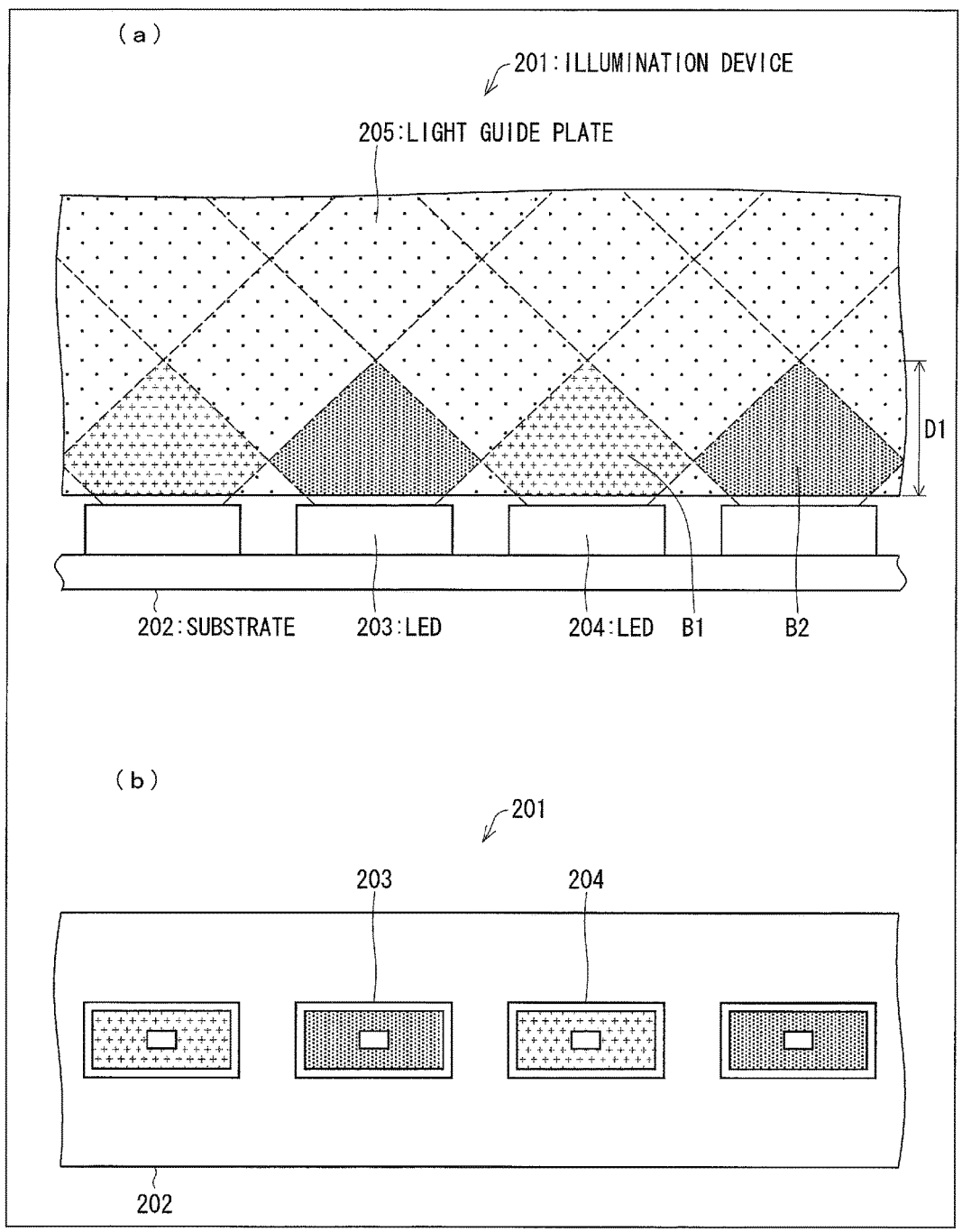
FIG. 21 (a) is a front view illustrating a portion of an illumination device of the related art which uses LEDs with different luminescent colors in an enlarged manner, and FIG. 21 (b) is a plan view illustrating a portion of a light source unit in the illumination device in an enlarged manner.
Figure 22:
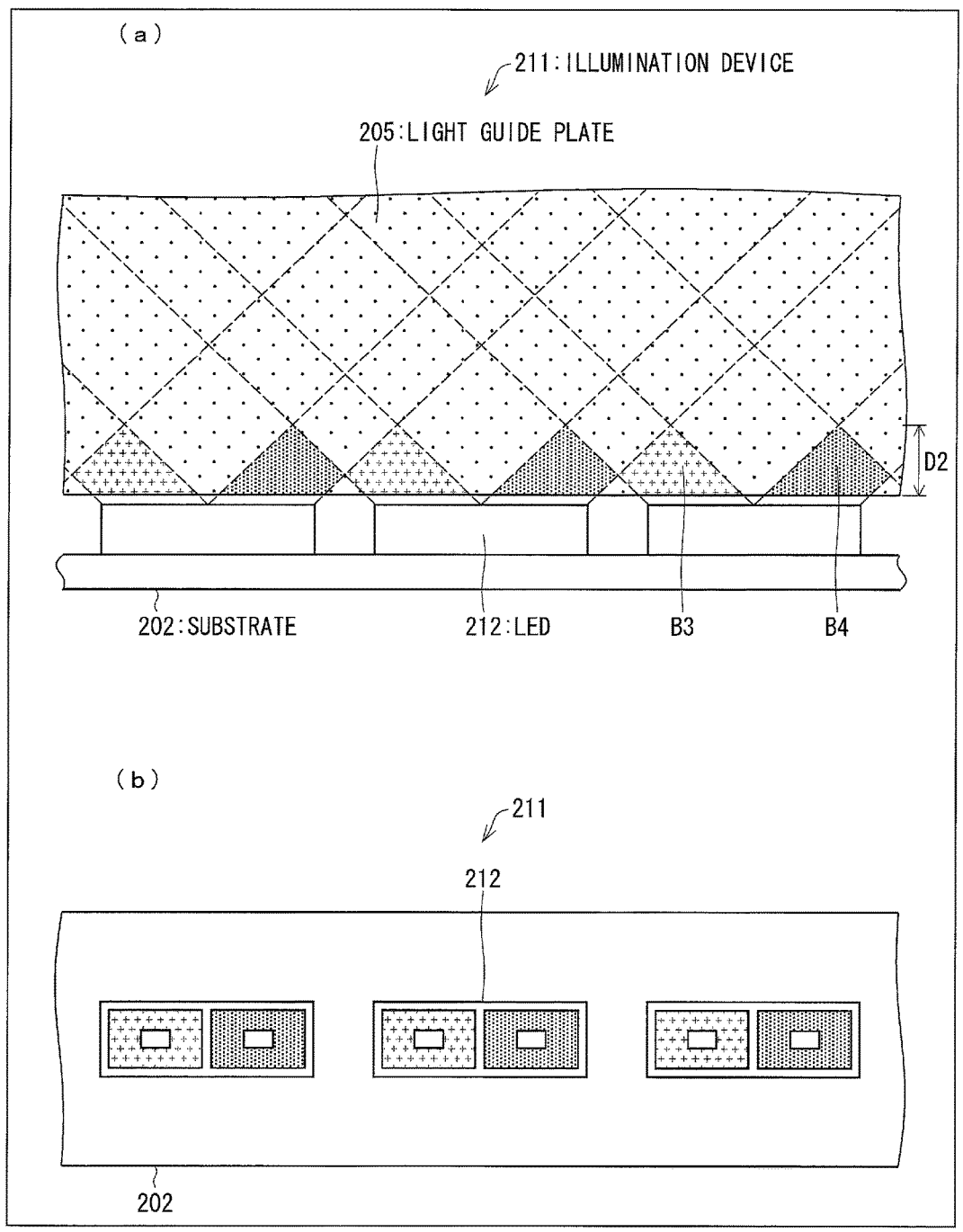
FIG. 22 (a) is a front view illustrating a portion of another illumination device of the related art which uses LEDs with different luminescent colors in an enlarged manner, and FIG. 22 (b) is a plan view illustrating a portion of a light source unit in the illumination device in an enlarged manner.

Specifically, in the light exit surface of the light guide plate 15, since the emitted light beams of the LEDs 13 and 14 appear to be color mixed in relation to the Y direction, a portion in which the luminescent color differs is not present in the light guide plate 15 as in the configurations of the related art illustrated in FIGS. 21 and 22. The LEDs 13 and 14 are disposed near the end portion of the light radiating surface 15b side and the end portion of the rear surface side opposite the light radiating surface 15b in the light entrance portion 15a of the light guide plate 15. Accordingly, when the emitted light of the LEDs 13 and 14 enters the light guide plate 15, the light is subjected to total reflection by the surface of the light guide plate 15 straight away. The reduction in the length of the color mixing distance in this manner also contributes to an improvement in the color mixing properties.

Due to the reflecting surface 7a of the package 7 being inclined, the emitted light from the LED chip 16 is reflected by the reflecting surface 7a to increase the emission angle of the light which is emitted from the opening of the package 7. Accordingly, this also contributes to an improvement in the light extraction efficiency which is emitted from the opening of the package 7, and to the shortening of the color mixing distance.

Since the LEDs 13 and 14 independently house the LED chips 16, it is possible to prevent the mutual absorption of the light between the LED chips 16 from occurring. Accordingly, it is possible to suppress a reduction in the luminous efficiency of the LEDs 13 and 14.

The LEDs 13 and 14 are configured to emit light of different colors by combining the LED chips 16 with the different phosphors 18 and 19, respectively. In contrast, in an LED in which the red phosphor 18 and the green phosphor 19 are mixed and dispersed, since the green light which is emitted by the phosphor 19 is absorbed by the phosphor 18 even though the green light does not contribute to the emission of the red light, the luminous efficiency is low. However, as in the LEDs 13 and 14, since the absorption of the green light which does not contribute to the emission of the red light by the phosphor 18 does not occur as in the above description due to using the phosphors 18 and 19 individually, a reduction in the luminous efficiency does not occur.

Since the shape of the light emitting surface (the light exit surface) of the LED 13 or 14 is rectangular and the longitudinal direction of the light emitting surface and the longitudinal direction of the substrate 12 are the same direction, it is possible to line up the LEDs 13 and 14 on the elongated substrate 12 in the width direction of the substrate 12. According to this shape, the directional characteristics of the LEDs 13 and 14 are wide in the long side direction of each of the light emitting surfaces of the LEDs 13 and 14, and the characteristics are narrow in the short side direction. Accordingly, since the light into the light entrance portion 15a is incident constrained in relation to the width direction of the light entrance portion 15a, the light entrance properties to the light guide plate 15 are improved.

Second Embodiment

Description will be given of the second embodiment of the present invention, with reference to FIGS. 4 to 13 and FIGS. 26 to 30.

Note that, in the present embodiment, components which have the same function as the components in the first embodiment described earlier will be assigned the same reference symbols, and description thereof will be omitted.
[Configuration of Illumination Device 21]

Figure 5:
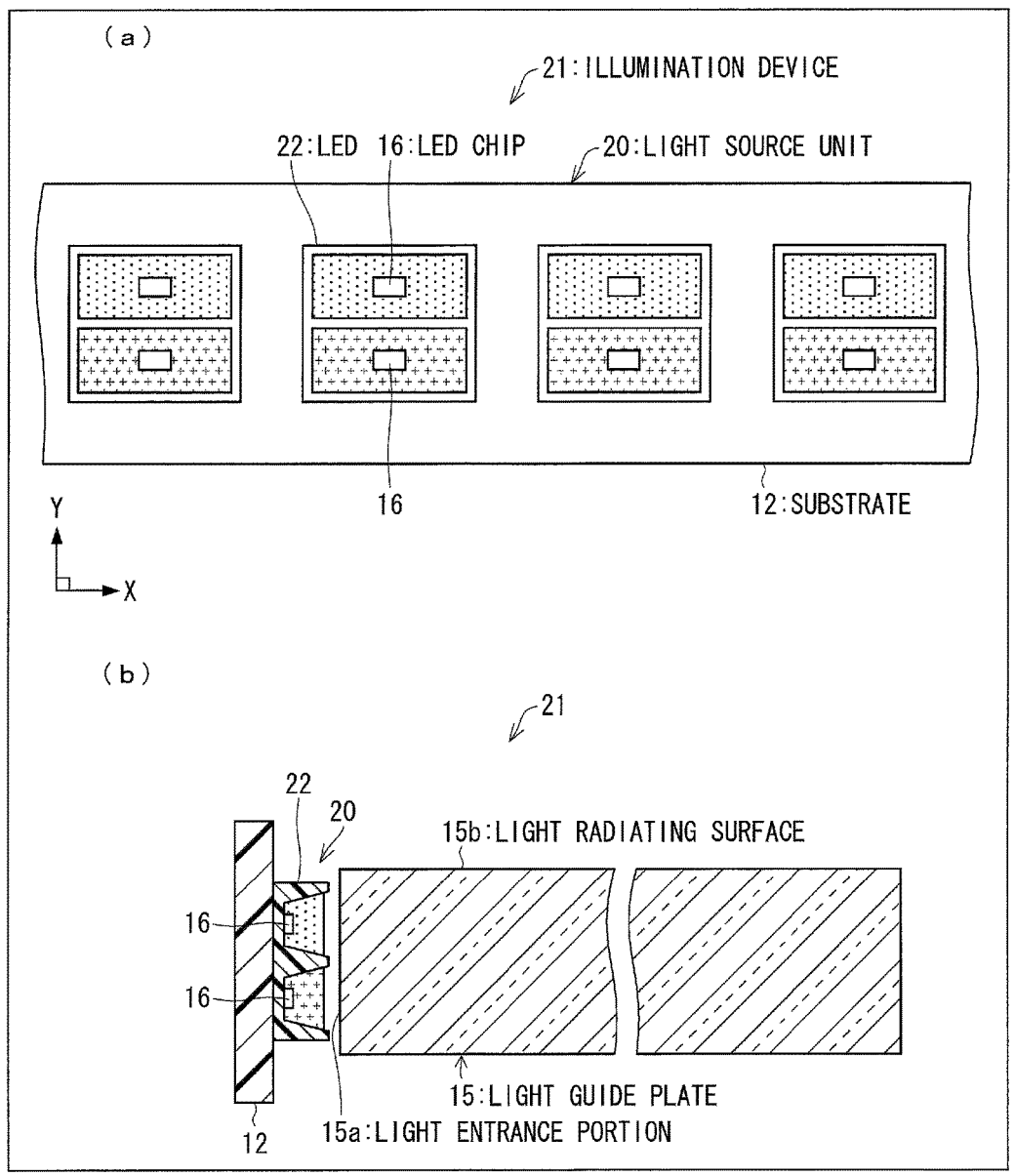
FIG. 5 (a) is a plan view illustrating a portion of a light source unit in an illumination device according to a second embodiment of the present invention in an enlarged manner, and FIG. 5 (b) is a longitudinal sectional diagram of the illumination device.

FIG. 5 (a) is a plan view illustrating a portion of a light source unit 20 in the illumination device 21 according to the second embodiment in an enlarged manner, and FIG. 5 (b) is a longitudinal sectional diagram of the illumination device 21.

As illustrated in FIGS. 5 (a) and 5 (b), the illumination device 21 is provided with the substrate 12, a plurality of LEDs 22, and the light guide plate 15.

The plurality of LEDs 22 is installed on the substrate 12 so as to line up in a row along the longitudinal direction (the X direction) of the substrate 12. The LED 22 includes two of the LED chips 16 which are disposed to leave an interval therebetween.

In the LEDs 22, one of the LED chips 16 of each of the LEDs 22 lines up in a row along the X direction, and the other LED chips 16 are disposed to line up in a row along the X direction. In the LEDs 22, between the adjacent rows, the LEDs 22 are disposed such that the two LED chips 16 line up in a direction (the Y direction) which orthogonally intersects the row direction (the X direction), leaving an interval therebetween.

The LED chips 16 which are lined up in the same row are connected in series, and form each of the LED circuits 5 and 6 described earlier. Accordingly, in the LED chips 16 which form each row, the applied constant current is controlled individually by the LED drive control unit 1 illustrated in FIG. 4.

The substrate 12 and the LEDs 22 form the light source unit 20. The light emitting surfaces of the LEDs 22 face the light entrance portion 15a, and the light source unit 20 is disposed in a position in the vicinity of the light guide plate 15 such that the emitted light from each of the two LED chips 16 in the LEDs 22 enters the light entrance portion 15a of the light guide plate 15.
[Configuration of LEDs 22]

Figure 6:
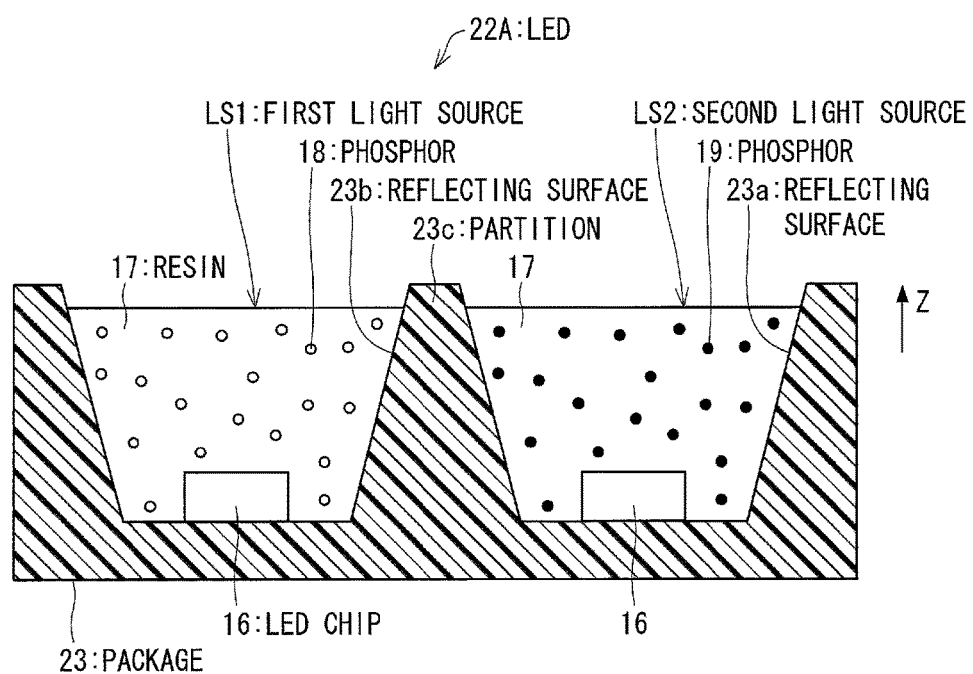
FIG. 6 is a longitudinal sectional diagram of a first LED in which blue LED chips are installed in the illumination device of FIG. 5.

FIG. 6 is a longitudinal sectional diagram of an LED 22A (the first LED) in the illumination device 21.

As illustrated in FIG. 6, the LED 22 in the light source unit 20 is configured as the LED 22A, for example. The LED 22A includes a package 23, the two LED chips 16, the resin 17, and the phosphors 18 and 19.

The package 23 includes two concave surface portions, each of which is the shape of a mortar which widens from the bottom surface to the opening. The LED chips 16 are respectively installed on the bottom surface of each concave surface portion, one each. Each of the concave surface portions forms a space (a concave portion) for filling with the respective resin 17. In the same manner as the package 7 in the first embodiment described earlier, the package 23 is formed of a nylon-based material, and is provided using insert molding such that a lead frame (not shown) is exposed to the bottom surface of the concave surface portion. The lead frame is divided into two at the two exposed portions.

The package 23 includes reflecting surfaces 23a and 23b which form the side surfaces of the concave surface portions. It is preferable that the reflecting surfaces 23a and 23b are formed of a metal film containing Ag or Al, or white silicone which have a high reflectance such that the emitted light of the LED chips 16 is reflected to the outside of the LED 22A. The reflecting surfaces 23a and 23b are formed to be inclined in relation to light which proceeds straight in the Z direction directly in front of the emission among the light which is emitted from the LED chips 16, that is, light with an emission angle of 0°.

The package 23 includes a partition 23c between the concave surface portions in the two locations. The emitted light from the two LED chips 16 is blocked between the two LED chips 16 in the LED 22A due to the partition 23c. In other words, the two LED chips 16 are optically isolated by the partition 23c.

One of the concave portions in the package 23 is sealed by being filled with the resin 17, and the phosphor 18 is dispersed in the resin 17. In the concave portion, a first light source LS1 is formed by the LED chip 16, the resin 17, and the phosphor 18.

The other concave portion in the package 23 is sealed by being filled with the resin 17, and the phosphor 19 is dispersed in the resin 17. In the concave portion, a second light source LS2 is formed by the LED chip 16, the resin 17, and the phosphor 19.

In the LED 22A which is configured as described above, as the primary light (the blue light) which is emitted from one of the LED chips 16 passes through the resin 17, a portion of the primary light excites the phosphor 18 and is converted into the secondary light (the red light). Accordingly, magenta light is radiated to the outside due to the color mixing of the blue primary light and the red secondary light. In the LED 22A, as the primary light (the blue light) which is emitted from the other LED chip 16 passes through the resin 17, a portion of the primary light excites the phosphor 19 and is converted into the secondary light (the green light). Accordingly, cyan light is radiated to the outside due to the color mixing of the blue primary light and the green secondary light. In this manner, magenta light and cyan light are radiated from the LED 22A to the outside.

Therefore, due to the LEDs 22A which are configured as described above being installed in the light source unit 20, the light source unit 20 radiates white light due to the mixing of the magenta light and the cyan light described above.

[Effects of Illumination Device 21]

Figure 7:
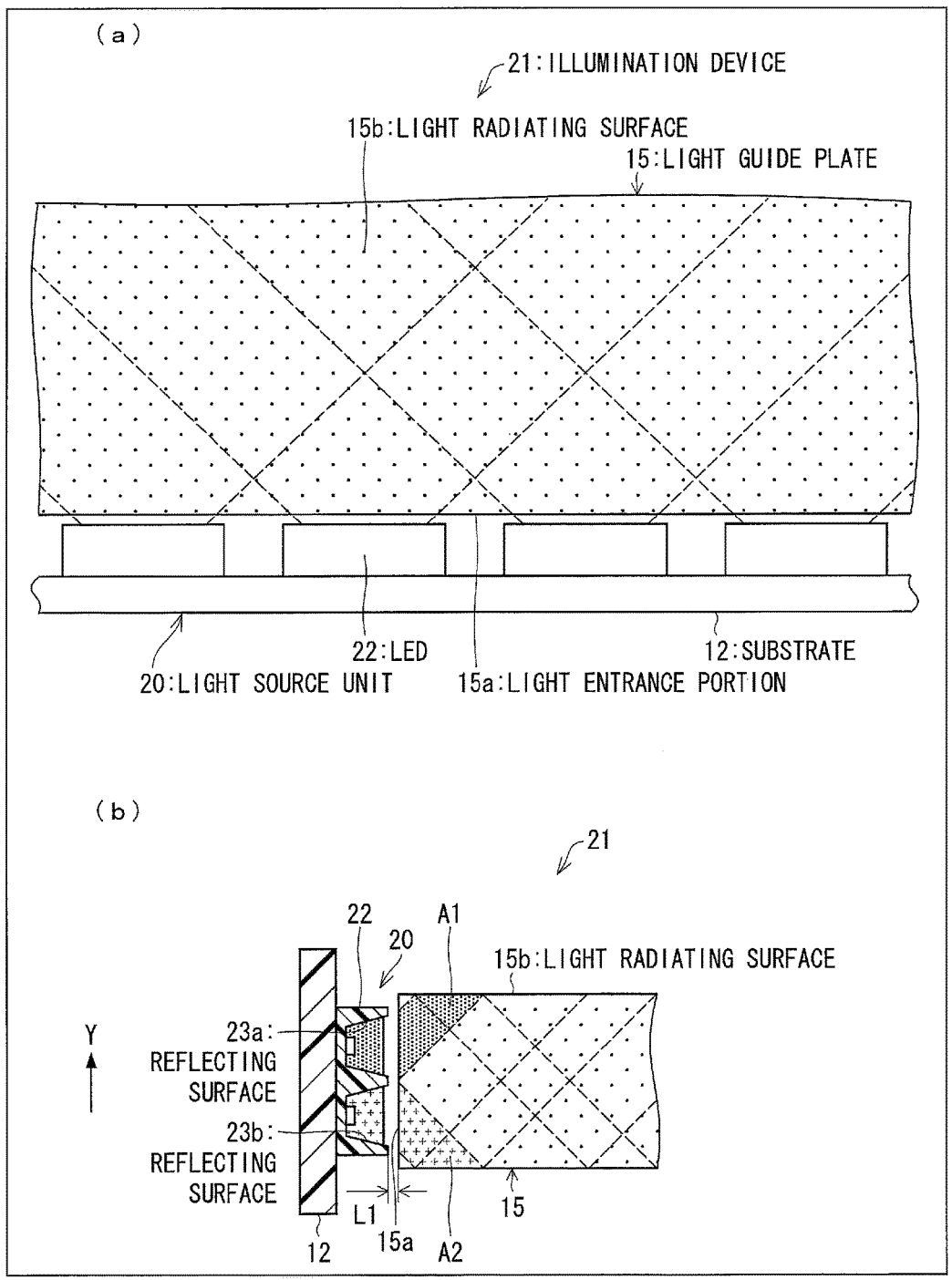
FIG. 7 (a) is a front view illustrating a portion of a color mixing state in the illumination device of FIG. 5 in an enlarged manner, and FIG. 7 (b) is a longitudinal sectional diagram of the illumination device.

FIG. 7 (*a*) is a front view illustrating a portion of a color mixing state in the illumination device 21 in an enlarged manner, and FIG. 7 (*b*) is a longitudinal sectional diagram of the illumination device 21.

As described above, the illumination device 21 of the present embodiment is provided with the light source unit 20 in which the LEDs 22 which emit light of different luminescent colors are installed on the substrate 12 to form rows. In the light source unit 20, the LEDs 22 are disposed such that, between the rows formed by the two LED chips 16 along the longitudinal direction of the substrate 12, the LED chips 16 line up in a direction (the Y direction) which orthogonally intersects the row direction (the X direction). In this manner, since the two LED chips 16 which are the light emission points of the LEDs 22 are lined up in the direction which orthogonally intersects the row, the color mixing properties of the emitted light from each of the LEDs 22 are improved due to the two light emission points being in the vicinity of each other.

Specifically, as illustrated in FIG. 7 (*b*), the emitted light from the LEDs 22 appears not to be color mixing in regions A1 and A2 in the light guide plate 15 from the side of the light guide plate 15. However, as illustrated in FIG. 7 (*a*), in the light radiating surface 15*b* of the light guide plate 15, the colors appear to be mixed in relation to the Y direction (the thickness direction of the light guide plate 15). Accordingly, portions in which the luminescent colors in the light guide plate 15 differ as in the configurations of the related art illustrated in FIGS. 21 and 22 are not present. The LED chips 16 in the LEDs 22 are disposed near the end portion of the light radiating surface 15*b* side and the end portion of the rear surface side opposite the light radiating surface 15*b* in the light entrance portion 15*a* of the light guide plate 15. Accordingly, when the emitted light of the LEDs 22 enters the light guide plate 15, the light is subjected to total reflection by the surface of the light guide plate 15 straight away (the regions A1 and A2). The reduction in the length of a color mixing distance L1 in this manner also contributes to an improvement in the color mixing properties.

Due to the reflecting surfaces 23*a* and 23*b* of the package 23 being inclined, the emitted light from the LED chips 16 is reflected by the reflecting surfaces 23*a* and 23*b* to increase the emission angle of the light which is emitted from the opening of the package 23. Accordingly, this also contributes to an improvement in the extraction efficiency of the light which is emitted from the opening of the package 23, and to the shortening of the color mixing distance L1 described above.

In contrast, in the LED 71 of the comparative example illustrated in FIG. 25, reflecting surfaces 72*a* and 72*b* of a package 72 are not inclined in relation to light with an emission angle of 0° of the emitted light of the LED chips 16. Therefore, the light which is emitted from the opening of the package 72 due to the emitted light from the LED chips 16 being reflected by the reflecting surfaces 72*a* and 72*b* does not widen as much as the emitted light of the LED 22. Therefore, the light extraction efficiency of the LED 71 is inferior to the light extraction efficiency of the LED 22. In addition, in an illumination device which uses the LED 71, since a color mixing distance L2 by the LED 71 is long in comparison to the color mixing distance L1 described above, the color mixing properties are inferior in comparison to the illumination device 21.

In the LEDs 22, since the two LED chips 16 are optically isolated by the partition 23*c*, it is possible to prevent the mutual absorption of the light between the LED chips 16 from occurring. Accordingly, it is possible to suppress a reduction in the luminous efficiency of the LEDs 22.

Since the LED chips 16 are stored (sealed) in the single package 23, it is possible to narrow the installation width of the LED 22 (the LED 22A) on the substrate 12. Accordingly, it is possible to narrow the width of the light entrance portion 15*a* which is determined according to the installation width, and to form the light guide plate 15 long and thin. In addition, the two LED chips 16 are installed on the substrate 12 at once by installing one of the LEDs 22 on the substrate 12. Accordingly, in the illumination device 21, since the workload of assembling the LED into the substrate 12 is reduced in comparison to the illumination device 11 of the first embodiment, it is possible to reduce the manufacturing cost of the illumination device 21.

Since the shape of the light emitting surface of the LED 22 is rectangular and the longitudinal direction of the light emitting surface and the longitudinal direction of the substrate 12 are the same direction, it is possible to line up the LEDs 22 on the elongated substrate 12 in the width direction of the substrate 12. According to this shape, the directional characteristics of the LEDs 22 are wide in the long side direction of each of the light emitting surfaces of the LEDs 22, and the characteristics are narrow in the short side direction. Accordingly, since the light into the light entrance portion 15*a* is incident constrained in relation to the width direction of the light entrance portion 15*a*, the light entrance properties to the light guide plate 15 are improved.

[Configuration and Effects of LEDs 22B]

Next, description will be given of the light source unit 20 in which another LED 22 is adopted.

Figure 8:
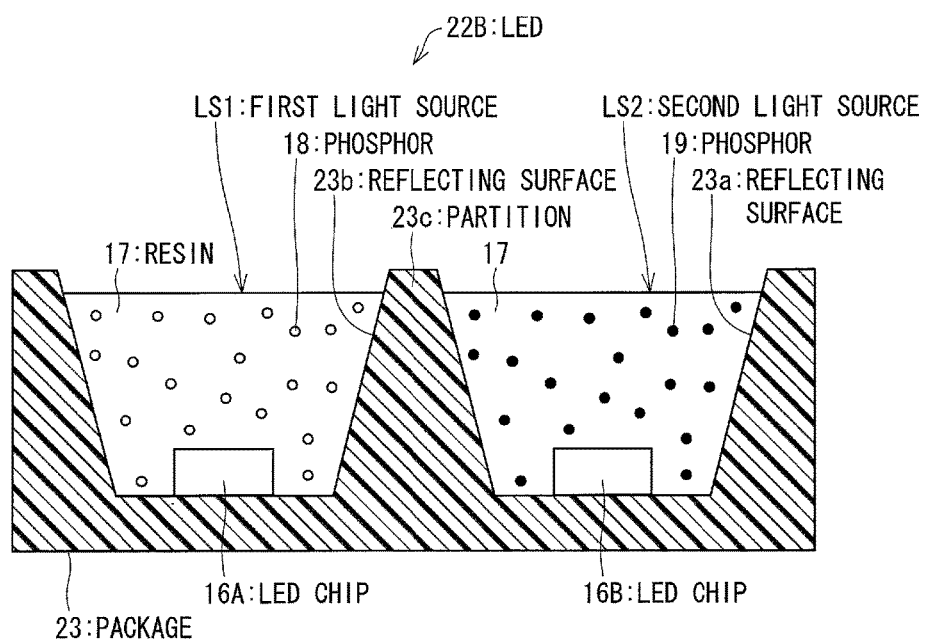
FIG. 8 is a longitudinal sectional diagram of a second LED in which blue LED chips are installed in the illumination device of FIG. 5.
Figure 9:
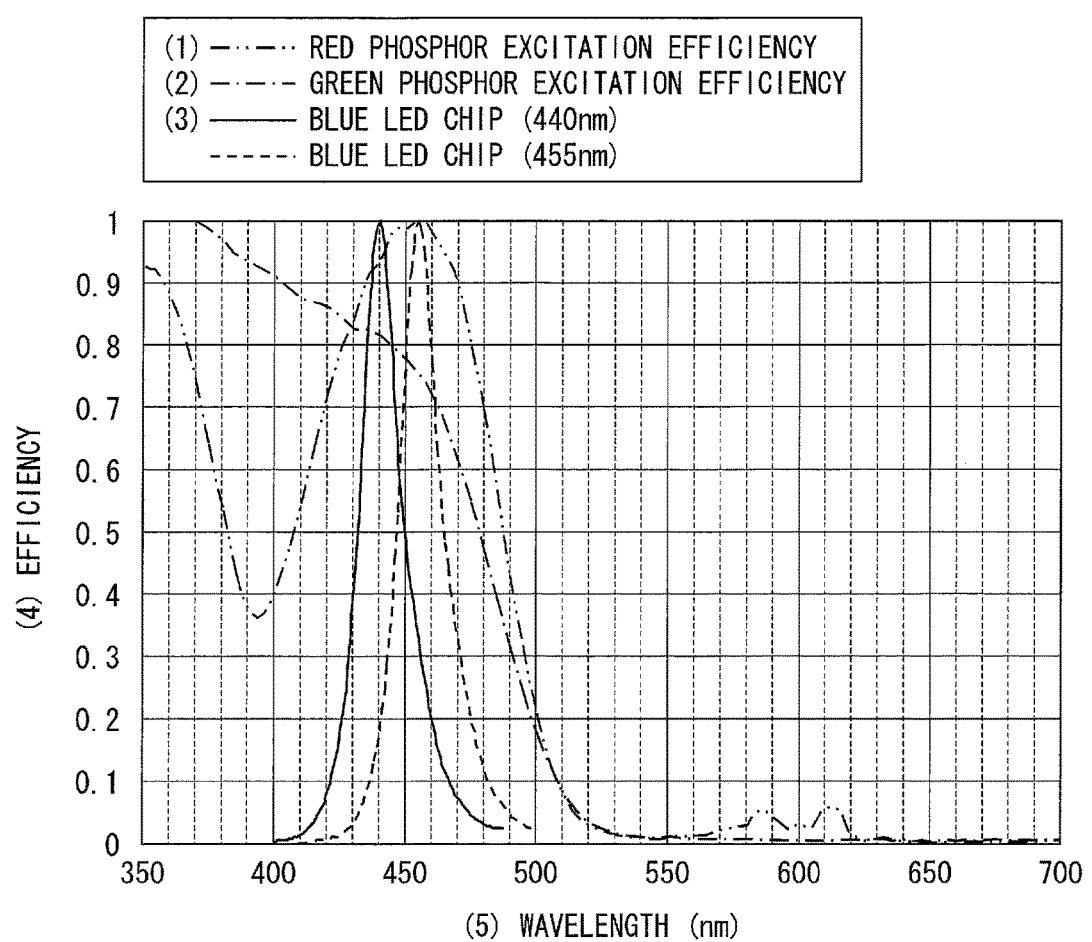
FIG. 9 is a graph illustrating the luminous efficiency of each LED chip and each phosphor in the LED of FIG. 8 in which the excitation wavelengths of the two blue LED chips which excite a red phosphor and a green phosphor, respectively are different.

FIG. 8 is a longitudinal sectional diagram of the LED 22B (the second LED) in which the blue LED chips 16 are installed in the illumination device 21. FIG. 9 is a graph illustrating the luminous efficiency of LED chips 16A and 16B, and the phosphors 18 and 19 in the LED 22B in which the excitation wavelengths of the two blue LED chips which excite the red phosphor and the green phosphor, respectively are different.

The light source unit 20 may include the LED 22B illustrated in FIG. 8 instead of the LED 22A described earlier. In the same manner as the LED 22A, the LED 22B includes the package 23, the resin 17, and the phosphors 18 and 19. The LED 22B includes the LED chips 16A and 16B instead of the LED chips 16 in the LED 22A. The LED chip 16A is provided in the first light source LS1, and the LED chip 16B is provided in the second light source LS2.

The LED chips 16A and 16B differ such that the peak wavelengths thereof are suitable for the optimal excitation wavelengths of the phosphors 18 and 19, respectively. For example, as illustrated in FIG. 9, the peak wavelength of the LED chip 16A which excites the phosphor 18 (the red phosphor) is 455 nm, and the peak wavelength of the LED chip 16B which excites the phosphor 19 (the green phosphor) is 440 nm. Accordingly, since the phosphor 18 is excited at the optimal excitation wavelength at which the excitation efficiency peaks, and the phosphor 19 is excited at the optimal excitation wavelength at which the excitation efficiency is greatest in relation to a lower limit value of the peak wavelength of the blue LED chip, it is possible to suppress a loss of light emission by the phosphors 18 and 19. Therefore, it is possible to improve the luminous efficiency of the LED 22.

[Configuration and Effects of LEDs 22C]

Next, description will be given of the light source unit 20 in which another LED 22 is adopted.

Figure 10:
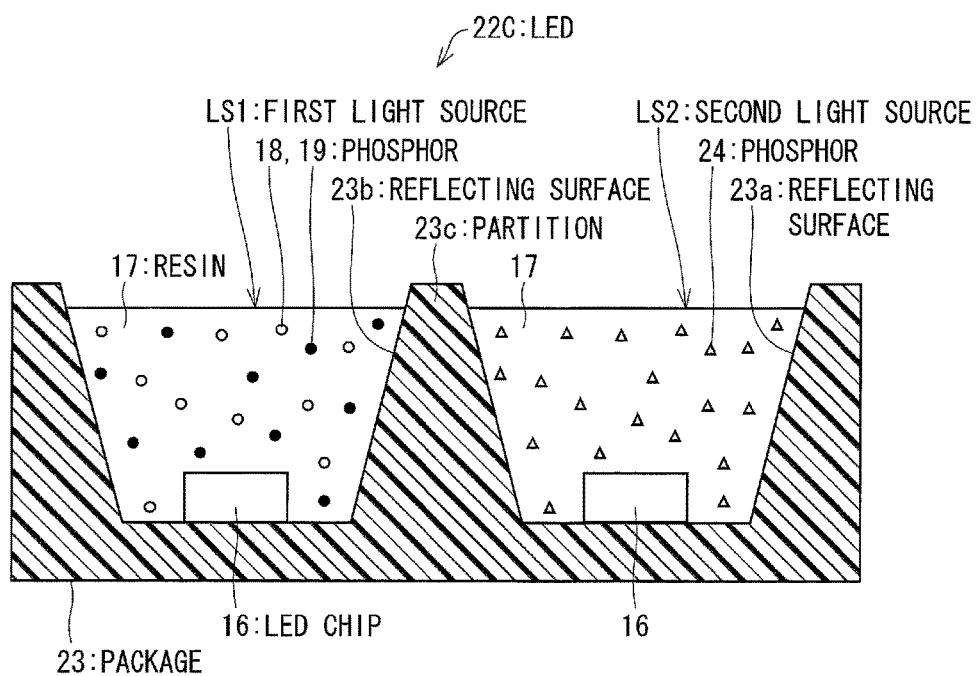
FIG. 10 is a longitudinal sectional diagram of a third LED in which blue LED chips are installed in the illumination device of FIG. 5.
Figure 11:
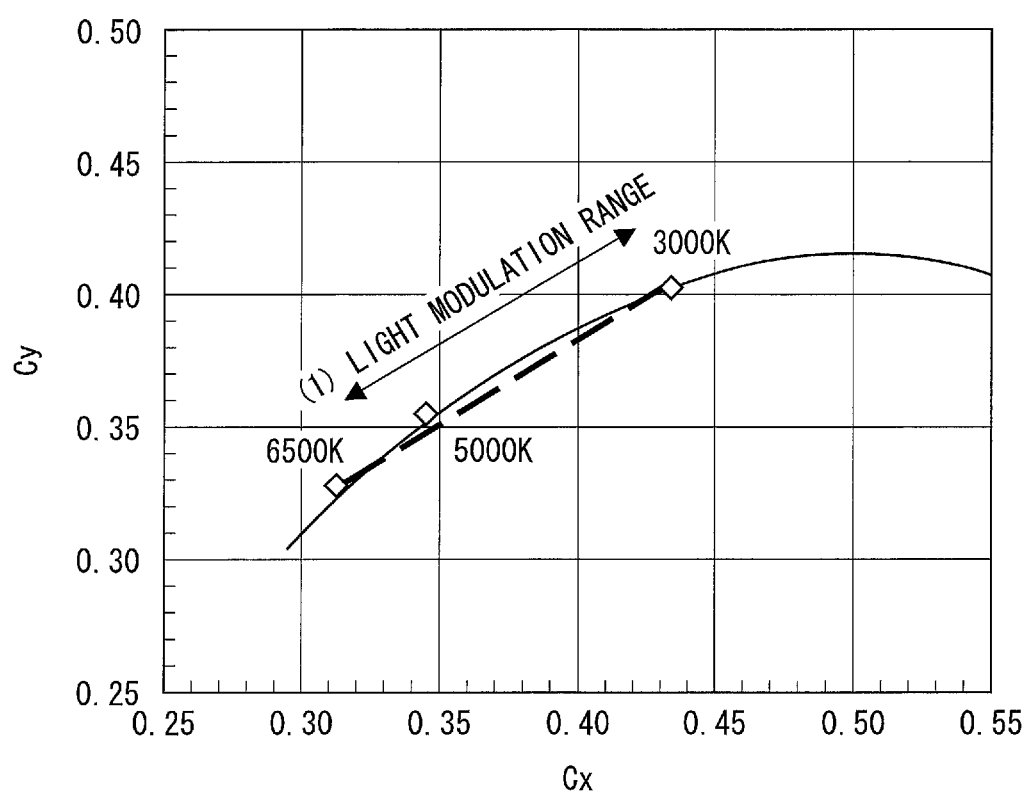
FIG. 11 is a graph illustrating a black-body radiation curve for identifying the two luminescent colors which are obtained using the LED of FIG. 10 as two chromaticity points.

FIG. 10 is a longitudinal sectional diagram of the LED 22C (the third LED) in which the blue LED chips 16 are installed in the illumination device 21. FIG. 11 is a graph illustrating a black-body radiation curve for identifying the two luminescent colors which are obtained using the LED 22C as two chromaticity points.

The light source unit 20 may include the LED 22C illustrated in FIG. 10 instead of the LED 22A described earlier. In the same manner as the LED 22A, the LED 22C includes the package 23, the two LED chips 16, the resin 17, and the phosphors 18 and 19; however, the LED 22C further includes a phosphor 24.

Unlike the LED 22A, in the LED 22C, the phosphors 18 and 19 are dispersed in the resin 17 with which one of the concave portions in the package 23 is filled, and the phosphor 24 is dispersed in the resin 17 with which the other concave portion is filled. The phosphor 24 (a yellow phosphor) is a yellow phosphor which emits secondary light of a longer wavelength of yellow (a peak wavelength from 560 nm to 590 nm) than the primary light, and, for example, is formed of a YAG:Ce phosphor material.

In the LED 22C which is configured as described above, in the first light source LS1 which is formed in one of the concave portions of the package 23, a luminescent color with a low color temperature such as incandescent, warm white, or white may be obtained using a combination of the blue LED chip 16, the red phosphor 18, and the green phosphor 19. In the second light source LS2 which is formed in the other concave portion of the package 23, a luminescent color with a high color temperature such as daylight may be obtained using a combination of the blue LED chips 16 and the yellow phosphor 24. Accordingly, as illustrated in FIG. 11, by mixing the colors of incandescent with a color temperature of 3000 K on a black-body radiation curve (a black-body radiation locus) and daylight with a color temperature of 6500 K, it is possible to obtain daylight with an intermediate color temperature of 5000 K.

In this manner, by mixing the white colors with two different color temperatures, it is possible to emit various whites. By changing the combination ratio or the combination amounts of the phosphors 18, 19, and 24 in the resin 17, it is possible to obtain various whites. It is also possible to obtain an arbitrary intermediate color based on whites with two different color temperatures by controlling the constant currents to be applied to the two LED chips 16 in the LED 22C using the LED drive control unit 1 illustrated in FIG. 4 to adjust the light intensity of each of the LED chips 16.

Note that, in the description given above, the LED 22C is illustrated in which the first light source LS1 is formed using a combination of the blue LED chip 16, the red phosphor 18, and the green phosphor 19, and the second light source LS2 is formed using a combination of the blue LED chip 16 and the yellow phosphor 24. However, the combination of the blue LED chips 16 in the first light source LS1 and the second light source LS2, and the red phosphor 18, the green phosphor 19, and the yellow phosphor 24 is not limited to the example described above.

For example, the first light source LS1 and the second light source LS2 may both be formed using a combination of the blue LED chips 16, the red phosphor 18, the green phosphor 19, and the yellow phosphor 24. In the LED 22C which is configured in this manner, it is possible to obtain various whites by setting, as appropriate, the combination ratio or the combination amounts of the phosphors 18, 19, and 24 in the resin 17 in the first light source LS1 and the second light source LS2. It is also possible to obtain an arbitrary intermediate color based on whites with two different color temperatures by controlling the constant currents to be applied to the two LED chips 16 in the LED 22C using the LED drive control unit 1 illustrated in FIG. 4 to adjust the light intensity of each of the LED chips 16.

[Configuration and Effects of LEDs 22D]

Description will be given of the light source unit 20 in which another LED 22 is adopted.

Figure 12:
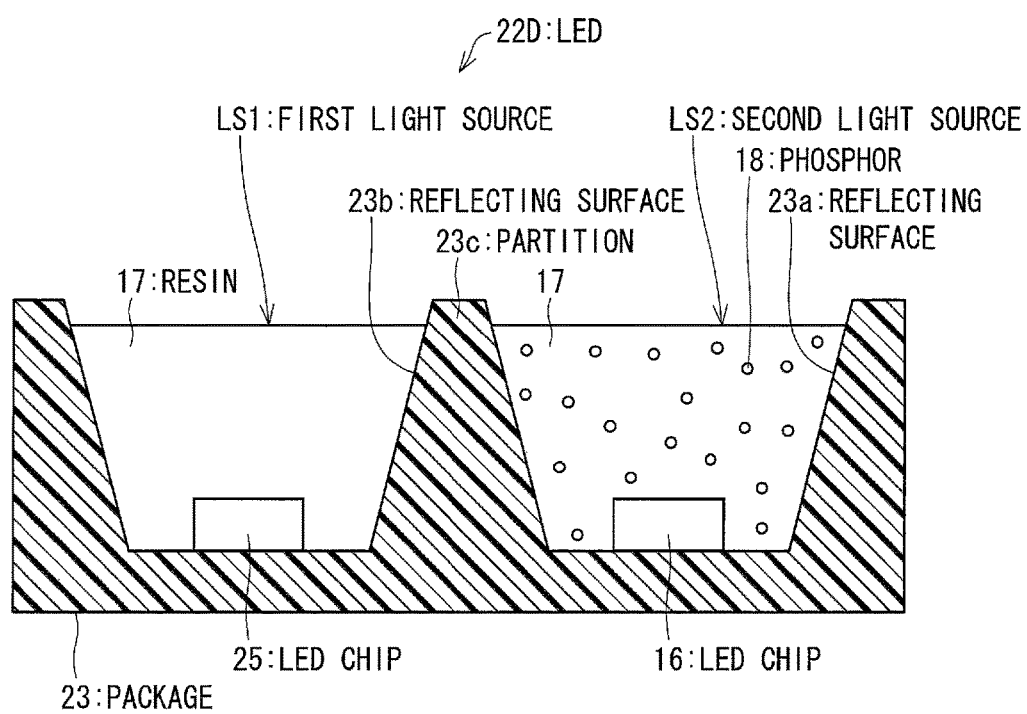
FIG. 12 is a longitudinal sectional diagram of a fourth LED in which a blue LED chip and a green LED chip are installed in the illumination device of FIG. 5.
Figure 13:
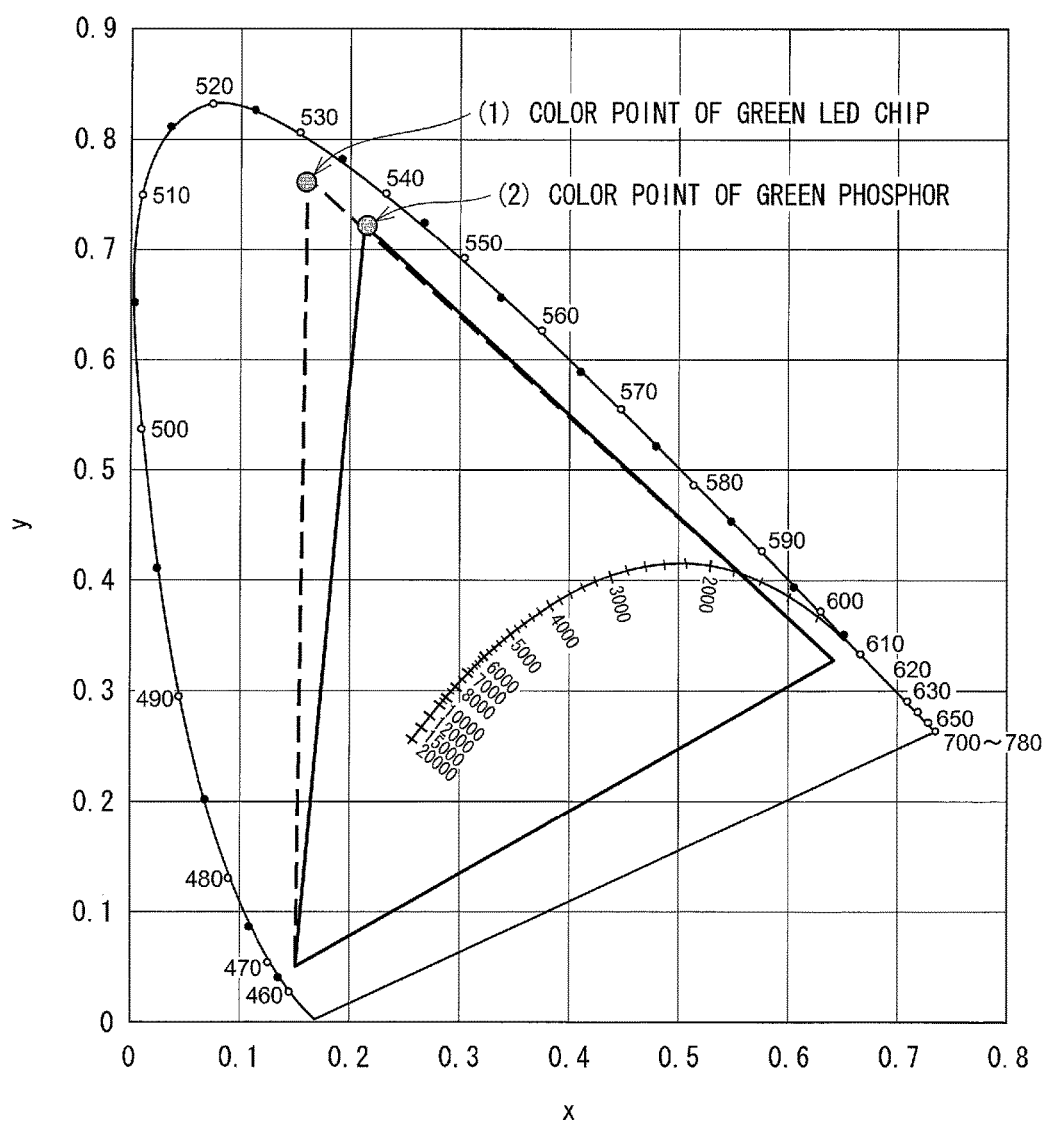
FIG. 13 is a chromaticity diagram illustrating chromaticity points of the green LED chip in the LED of FIG. 12 and the chromaticity points of a green phosphor in an LED of the related art.

FIG. 12 is a longitudinal sectional diagram of the LED 22D (the fourth LED) in which the blue LED chip 16 and a green LED chip 25 are installed in the illumination device 21. FIG. 13 is a chromaticity diagram illustrating chromaticity points of the green LED chip 25 in the LED 22D and the chromaticity points of a green phosphor in an LED of the related art.

The light source unit 20 may include the LED 22D illustrated in FIG. 12 instead of the LED 22A described earlier. In the same manner as the LED 22A, the LED 22D includes the package 23, the LED chip 16, the resin 17, and the phosphor 18; however, the LED 22D further includes the green LED chip 25.

Unlike the LED 22A, in the LED 22D, the LED chip 25 is installed in the first light source unit LS1 which is formed in one of the concave portions in the package 23 and the first light source LS1 is filled with the resin 17; however, the phosphor is not dispersed. In the second light source unit LS2 which is formed in the other concave portion in the LED 22D, the phosphor 18 is dispersed in the resin 17 with which the second light source LS2 is filled. The LED chip 25 (the green LED chip) is a GaN-based green LED. The emitted light (the primary light) of the LED chip 25 is green light in the range of 510 to 630 nm, and has a peak wavelength in the vicinity of 560 nm.

In the LED 22D which is configured as described above, while the green light which is emitted by the green LED chip 25 is obtained using the first light source LS1, the magenta light is obtained as a mixed color of the blue light from the blue LED chip 16 and the red color from the phosphor 18 using the second light source LS2. White light is obtained through the color mixing of the green light and the magenta light.

As illustrated in FIG. 13, the chromaticity point of the green light which is emitted by the LED chip 25 is closer to the outside than the chromaticity coordinate which is defined by the chromaticity point of the green light which is emitted by the green phosphor. Accordingly, it is possible to increase the area of the triangle illustrated by the broken line joining the three chromaticity points of red, blue, and green.

The colors in a television image are reproduced by adjusting the light intensity of each of the colors on the inside of the triangle described above. Therefore, the larger the area of the triangle, the more the color reproduction properties improve.

With regard to this, the chromaticity point of the green light which is emitted by the green phosphor is positioned on the inside of the chromaticity point chromaticity coordinate of the green LED light, as illustrated in FIG. 13. Therefore, as illustrated by the solid line, the area of the triangle which is defined by the chromaticity point of the green light which is emitted by the green phosphor is smaller than the area of the triangle of the case in which the LED chip 25 is used. Therefore, the color reproduction properties of the case in which the green phosphor is used are inferior to the color reproduction properties of the case in which the LED chip 25 is used.

Accordingly, in order to realize high color reproduction properties, it is preferable to use the green LED chip 25 rather than using the green phosphor.

Note that, even in the case of the red chromaticity, when the case in which the red phosphor is used is compared to the case in which the red LED chip is used, since the chromaticity coordinate of the chromaticity point of the case in which the red LED chip is used is positioned closer to the outside, the color reproduction properties are increased. Therefore, in the LED 22D, in addition to installing the red LED chip instead of the LED chip 25, the red phosphor 18 may be exchanged for the green phosphor 19 (a combination of the blue LED chip 16 and the green phosphor 19). Accordingly, it is possible to improve the color reproduction properties in the same manner as the LED 22D described above.

[Configuration and Effects of LEDs 22E]

Description will be given of the light source unit 20 in which another LED 22 is adopted.

Figure 26:
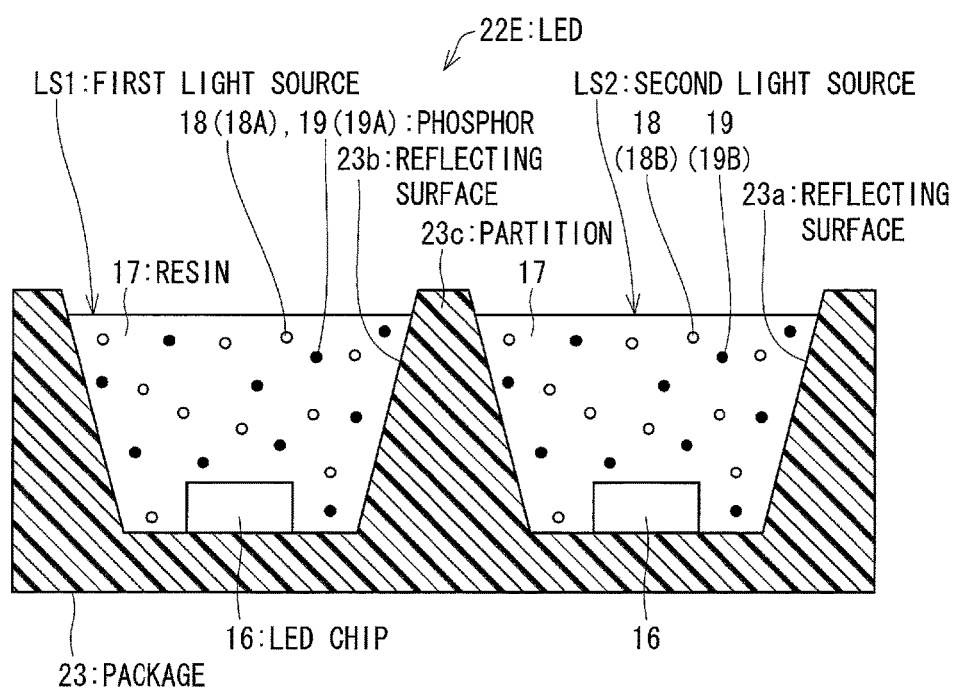
FIG. 26 is a longitudinal sectional diagram of a fifth LED in which blue LED chips are installed in the illumination device of FIG. 5.
Figure 27:
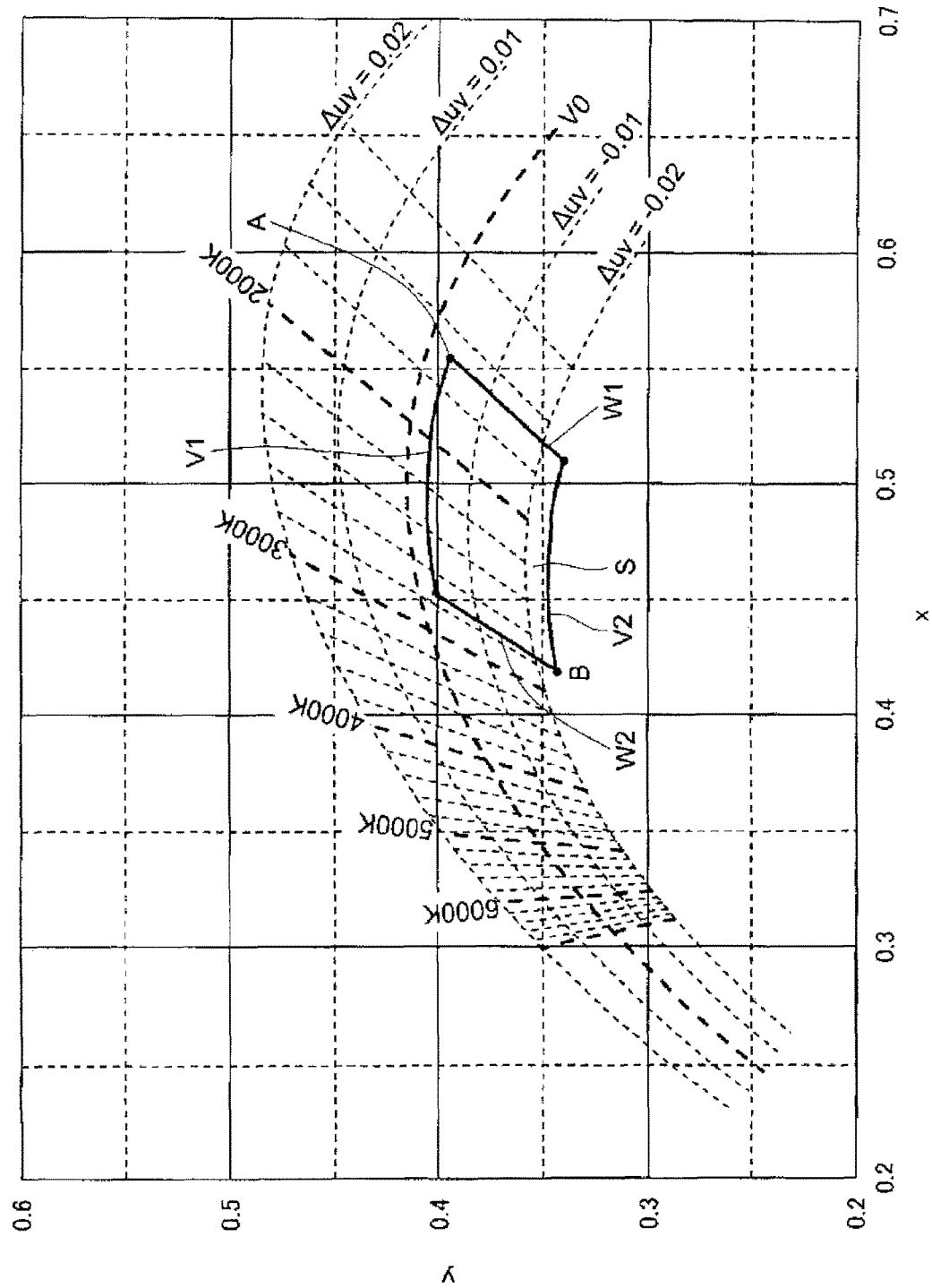
FIG. 27 is an xy chromaticity diagram illustrating the illumination color of the fifth LED.

FIG. 26 is a longitudinal sectional diagram of the LED 22E (the fifth LED) in which the blue LED chips 16 are installed in the illumination device 21. FIG. 27 is an xy chromaticity diagram illustrating the illumination color of the LED 22E.

The light source unit 20 may include the LED 22E illustrated in FIG. 26 instead of the LED 22A described earlier. In the same manner as the LED 22A, the LED 22E includes the package 23, the two LED chips 16, the resin 17, and the phosphors 18 and 19.

Unlike the LED 22A, in the LED 22E, the phosphors 18 and 19 are dispersed in the resin 17 with which both of the concave portions in the package 23 are filled.

(First Configuration)

In the LED 22E according to the first configuration, the same phosphors 18 and 19 are dispersed in the resin 17 in the first light source LS1 which is formed in one of the concave portions of the package 23 and the second light source LS2 which is formed in the other concave portion. However, the first light source LS1 and the second light source LS2 emit different colors of light due to the combination ratio or the combination amounts of the phosphors 18 and 19 being different.

Specifically, the first light source LS1 emits neutral white light with a color temperature of 5000 K, and the second light source LS2 emits orange pink light. The chromaticity point of the neutral white described above is (x=0.347, y=0.359) or the vicinity thereof, and the chromaticity point of the orange pink described above is (x=0.499, y=0.382) or the vicinity thereof. In particular, it is possible to obtain the orange pink light by adjusting (increasing the red component) the combination ratio or the combination amount of the phosphor 18 so as to be greater than the combination ratio or the combination amount of the phosphor 19.

Note that, "orange pink" corresponds to a light source color which is defined in JIS (Japanese Industrial Standard) standard (JIS Z8110).

As described in PTL 4 (Japanese Patent 2013-171686), the coloring light in the vicinity of the chromaticity point (x=0.499, y=0.382) which is emitted from the second light source LS2 described above is a color capable of promoting natural, good quality sleep in a person. As illustrated in FIG. 27, the effect of promoting sleep using this color may be obtained using chromaticities within a region S surrounded by an isotemperature line W1 (a first isotemperature line) and an isanomalous line V1 (a first isanomalous line) in relation to a black-body radiation locus V0 which pass through a point A (0.555, 0.394), and an isotemperature line W2 (a second isotemperature line) and an isanomalous line V2 (a second isanomalous line) in relation to the black-body radiation locus V0 which pass through a point B (0.419, 0.343) in the xy chromaticity diagram defined by the International Commission on Illumination.

In regard to the chromaticity range of the light source, if the effect of promoting sleep is focused on, the chromaticity in the region S described above may be realized. Generally, it is said that if the chromaticity variation remains within the range of a 3-step MacAdam ellipse, this is a level at which the human eye is not capable of distinguishing the difference in the color. Therefore, it is preferable that the first light source LS1 has a chromaticity range of a 3-step MacAdam ellipse, centered on the chromaticity point (x=0.347, y=0.359), and that the second light source LS2 has a chromaticity range of a 3-step MacAdam ellipse, centered on the chromaticity point (x=0.499, y=0.382).

In the configuration of the illumination device, there is a case in which a plurality of light source are used in order to secure the light amount. In this case, it is possible to select and combine the light sources so as to absorb the chromaticity variation of the light sources. Therefore, even if the chromaticities of the first light source LS1 and the second light source LS2 are set to chromaticities within ranges of 5-step MacAdam ellipses, there is a likelihood that the illumination device is able to maintain a level of hue which the human eye is not capable of distinguishing. In this manner, the range of the chromaticity of the LED 22E may be set, as appropriate, according to the configuration or usage of the illumination device.

In the LED 22E according to the first configuration, it is possible to tone the light at a chromaticity which joins between the orange pink and the neutral white by controlling the light intensity of the first light source LS1 and the second light source LS2. A chromaticity in the vicinity of the chromaticity point (x=0.416, y=0.377) is present on a coordinate line joining the orange pink and the neutral white. The LED 22E is capable of emitting light of the color of this chromaticity by adjusting the light intensity of the first light source LS1 and the second light source LS2. According to PTL 5 (Japanese Unexamined Patent Application Publication No. 2013-171687), this luminescent color is a color which is capable of reducing a sense of fatigue and improving the working efficiency of a person.

When performing the light adjustment described above, the turning on the first light source LS1 and the second light source LS2 is controlled by the LED drive control unit 1 in the following manner.

First, when obtaining the neutral white light, the first light source LS1 is turned on, and the second light source LS2 is turned off. When obtaining the orange pink light, the first light source LS1 is turned off, and the second light source LS2 is turned on. When obtaining the light which includes a color of a chromaticity point between the neutral white and the orange pink, the turning on of the first light source LS1 and the second light source LS2 is controlled so as to adjust the ratio of the luminous flux amount (lumens) of each of the first light source LS1 and the second light source LS2. In particular, when obtaining the light of a color in the vicinity of the chromaticity point (x=0.416, y=0.377), the first light source LS1 and the second light source LS2 are turned on such that the luminous flux amount (lumens) of each of the first light source LS1 and the second light source LS2 is a ratio of approximately 1:1.16 (neutral white: orange pink).

Note that, the ratio of the luminous flux amount of the first light source LS1 and the second light source LS2 differs according to the type of phosphors 18 and 19, the optical material which is used in the light guide plate 15, and the like. Therefore, the ratio of the luminous flux amount when obtaining the light of the colors described above is merely an example.

The first light source LS1 and the second light source LS2 may be luminescent colors which can sufficiently contain the coordinates of the chromaticities described above through toning.

For example, the GaN-based semiconductor light emitting element described earlier is used as the LED chip 16 (peak in the vicinity of 450 nm), the $CaAlSiN_3$:Eu described earlier is used as the phosphor 18, and the Eu-doped β SiAlON is used as the phosphor 19. The combination ratio or the combination amounts of the phosphors 18 and 19 described above are set, as appropriate, and the luminescent colors of each of the first light source LS1 and the second light source LS2 are set. In this case, the luminescent colors of the first light source LS1 and the second light source LS2 are colors other than the neutral white and the orange pink described earlier. In the xy chromaticity diagram, a line joining the chromaticity point of the neutral white (x=0.347, y=0.359) and the chromaticity point of the orange pink (x=0.499, y=0.382) is extended, and the luminescent colors of the first light source LS1 and the second light source LS2 are set to chromaticity points in the vicinity of coordinates on the extended line. Accordingly, it is possible to tone the luminescent color containing the neutral white light and the orange pink using the first light source LS1 and the second light source LS2.

The turning on of the first light source LS1 and the second light source LS2 is controlled so as to adjust the ratio of the luminous flux amount (lumens) of each of the first light source LS1 and the second light source LS2, and light which is neutral white, orange pink, or the like, is obtained. In the example described earlier, neutral white with a color temperature of 5000 K is described as the white light of the first light source LS1; however, the white light as the illumination device may be any chromaticity from incandescent with a color temperature of approximately 2400 K to daylight with a color temperature of approximately 7000 K. When the white light is neutral white with a color temperature of approximately 5000 K, since it is possible to include the chromaticity point (x=0.416, y=0.377) on the chromaticity coordinates joining the neutral white and the orange pink in the range in which it is possible to perform the toning, this is more desirable.

(Second Configuration)

As illustrated in FIG. 26, in the LED 22E according to the second configuration, unlike the LED 22E according to the first configuration, phosphors 18A and 19 are dispersed in the resin 17 of the first light source LS1, and phosphors 18B and 19 are dispersed in the resin 17 of the second light source LS2.

The phosphor 18A is formed of a phosphor material of a forbidden transition type, for example, a phosphor material (KSF) obtained by mixing $K_2SiF_6$:Mn. Meanwhile, the phosphor 18B is formed of a phosphor material of an allowed transition type, for example, a phosphor material (CASH) obtained by mixing $CaAlSiN_3$:Eu.

In the LED 22E according to the second configuration described above, a phosphor material of a forbidden transition type which has a narrow spectrum with good color rendering properties but a slow (ms order) reaction speed is used as the phosphor 18A of the first light source LS1, and a phosphor material of an allowed transition type which has a fast (μs order) reaction speed is used as the phosphor 18B of the second light source LS2. In this manner, since the characteristics of the phosphors 18A and 18B are different, it is possible to obtain light with different characteristics by controlling the light amounts of the first light source LS1 and the second light source LS2 according to conditions.

For example, when raising the color rendering properties, the light amount of the first light source LS1 is controlled to be more than the light amount of the second light source LS2. Meanwhile, when reducing the persistence, the light amount of the second light source LS2 is controlled to be more than the light amount of the first light source LS1. In particular, the reducing of the persistence is effective in the backlight for a liquid crystal TV in which a case (3D display, backlight scanning, and the like) is anticipated in which the backlight dimming frequency (PWM) is 240 Hz or less.

Therefore, it is possible to use the LED 22E according to the second configuration favorably in a display device which performs display in which the color rendering properties are raised and display in which the persistence is reduced.

Note that, although description is given of a combination of a KSF phosphor and a CASN phosphor as the red phosphors 18A and 18B which are used in the LED 22E, the configuration is not limited thereto. For example, a SCASN phosphor or an α SiAlON phosphor may be used instead of the CASN phosphor as the phosphor material of the allowed transition type. The SCASN phosphor and the α SiAlON phosphor are represented by the following chemical formulas.

Chemical formula of SCASN phosphor: $(Sr, Ca) AlSiN_3$:Eu Chemical formula of α SiAlON phosphor: $Ca(Si, Al)_{12}(O,N)_{16}$:Eu For example, a red phosphor substance illustrated in an eighth embodiment described later may be used as the phosphor material of the forbidden transition type.

(Third Configuration)

As illustrated in FIG. 26, in the LED 22E according to the third configuration, in the same manner as the LED 22E according to the second configuration, the red phosphor 18A is dispersed in the resin 17 of the first light source LS1, and the red phosphor 18B is dispersed in the resin 17 of the second light source LS2. However, in the LED 22E according to the third configuration, a green phosphor 19A is dispersed in the resin 17 of the first light source LS1, and a green phosphor 19B is dispersed in the resin 17 of the second light source LS2.

The phosphors 18A and 18B are formed of the same phosphor material as the phosphor material described above used in the LED 22E according to the second configuration.

The phosphor 18B may be formed of a phosphor material other than the CASN described above, as long as the phosphor material is a phosphor material of the allowed transition type. The phosphor 19A is formed of a Mn-doped γ-AlON phosphor material. Meanwhile, the phosphor 19B is formed of the Eu-doped β SiAlON phosphor material described earlier. The Mn-doped γ-AlON has a slow (ms order) reaction speed and persistence occurs in the same manner as the KSF ($Mn^{4+}$-doped compound fluoride phosphor) described earlier which is used as the phosphor 18A. In contrast, the Eu-doped β SiAlON has a fast (μs order) reaction speed in the same manner as the CASN described earlier which is used as the phosphor 18B.

In the same manner as the LED 22E according to the second configuration, in the LED 22E according to the third configuration described above, a phosphor material of a forbidden transition type which has a narrow spectrum with good color rendering properties but a slow reaction speed is used as the phosphor 18A of the first light source LS1, and a phosphor material of an allowed transition type which has a fast reaction speed is used as the phosphor 18B of the second light source LS2. In this manner, since the characteristics of the phosphors 18A and 18B are different, it is possible to obtain light with different characteristics by controlling the light amounts of the first light source LS1 and the second light source LS2 according to conditions.

The phosphor 19A is formed of a phosphor material with a slow reaction speed, and the phosphor 19B is formed of a phosphor material with a fast reaction speed. Accordingly, the reaction speeds of the phosphors 18A and 19A in the first light source LS1 have the same order level, and the reaction speeds of the phosphors 18B and 19B in the second light source LS2 have the same order level. Therefore, when adjusting the light amount ratio of the first light source LS1 and the second light source LS2, it is easy to balance the persistence amounts between the phosphors.

However, in the LED 22E according to the second configuration described earlier, it is possible to adopt a combination of phosphor materials such that the order levels of the reaction speeds of the phosphors 18A and 19 in the first light source LS1 differ, and the order levels of the reaction speeds of the phosphors 18B and 19 in the second light source LS2 differ. However, even if such a combination of phosphor materials is used, if the persistence characteristics of the phosphors 18A and 18B are different, there is no impediment to appropriate use in high color rendering properties display and in persistence reduced display as described earlier.

[Configuration and Effects of LEDs 22F]

Description will be given of the light source unit 20 in which another LED 22 is adopted.

Figure 28:
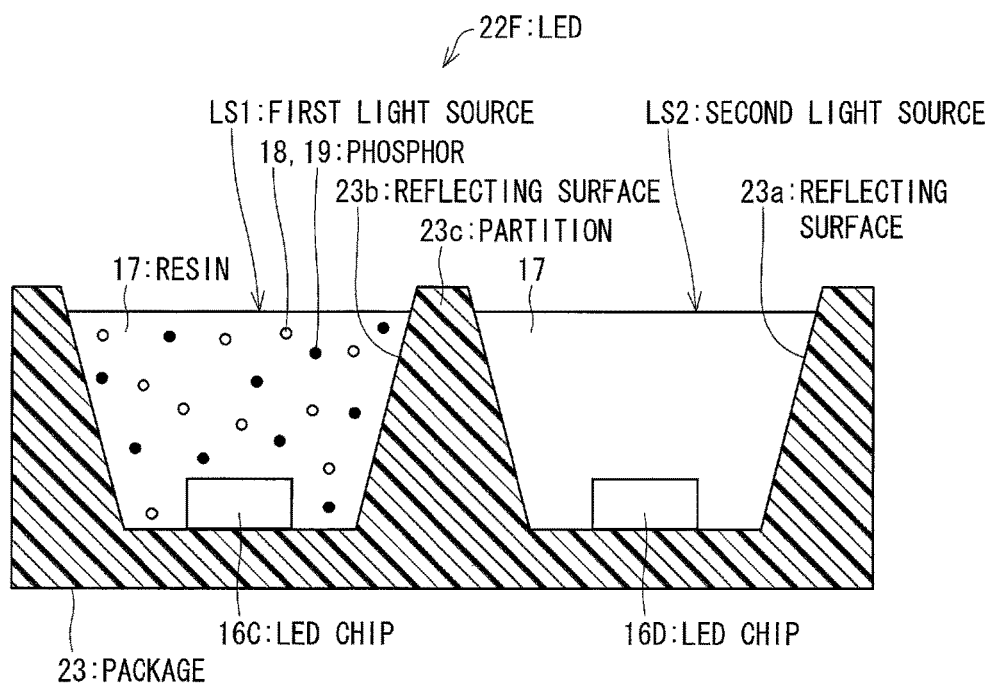
FIG. 28 is a longitudinal sectional diagram of a sixth LED in which blue LED chips are installed in the illumination device of FIG. 5.

FIG. 28 is a longitudinal sectional diagram of the LED 22F (the sixth LED) in which the blue LED chips 16 are installed in the illumination device 21.

The light source unit 20 may include the LED 22F illustrated in FIG. 28 instead of the LED 22A described earlier. In the same manner as the LED 22A, the LED 22F includes the package 23, the resin 17, and the phosphor 18. The LED 22F includes LED chips 16C and 16D instead of the LED chips 16 in the LED 22A.

Unlike in the LED 22A, in the LED 22F, the phosphors 18 and 19 are dispersed in the resin 17 of the first light source LS1, and phosphors are not dispersed in the resin 17 of the second light source LS2. The first light source LS1 includes the LED chip 16C, and the second light source LS2 includes the LED chip 16D. The LED chips 16C and 16D have different peak wavelengths from each other.

(First Configuration)

In the LED 22F according to the first configuration described above, while the peak wavelength of the LED chip 16C is from 415 nm to less than 460 nm, the peak wavelength of the LED chip 16D is from 460 nm to 500 nm.

The output light from the LED chip 16C has a higher excitation efficiency in relation to the phosphors 18 and 19 than the output light from the LED chip 16D. Most of the light energy which is output from the LED chip 16C is consumed exciting the phosphors 18 and 19, and mainly red light and green light are emitted from the first light source.

Accordingly, the main blue component of the white light which is obtained from the LED 22F is the blue light which is emitted from the second light source LS2. Since the influence of the blue light on the retina of a human eye is small, it is possible to reduce the blue light. Therefore, it is possible to use the LED 22F according to the first configuration favorably in the illumination equipment and the display device.

In the LED 22F, since the two LED chips 16C and 16D are optically isolated by the partition 23c, the blue light of the second light source LS2 does not excite the phosphors 18 and 19 of the first light source LS1. Accordingly, since the blue light of the second light source LS2 is not absorbed by the phosphors 18 and 19, it is possible to favorably maintain the luminous efficiency of the second light source LS2. Since the blue light of the second light source LS2 does not influence the light emission of the phosphors 18 and 19, it is easy to adjust the chromaticity of the first light source LS1.

Note that, since most of the blue light which is output from the LED chip 16C is absorbed by the phosphors (is converted into red light and green light by the excitation of the phosphors and output), there is a large reduction in the blue light which is output to the outside of the package 23. For the blue to be delivered to a human eye, the output light of the LED chip 16D (peak wavelength from 460 nm to 500 nm) is output as it is to the outside of the package 23. Therefore, in the light spectrum of the LED 22F, the integrated light emission intensity from 415 nm to less than 460 nm is greater than the integrated light emission intensity from 460 nm to less than 500 nm.

(Second Configuration)

In the LED 22F according to the second configuration, the peak wavelength of the LED chip 16C is from 350 nm to 410 nm (blue light to near-ultraviolet light), and the peak wavelength of the LED chip 16D is a predetermined range (around 445 nm) centered on 445 nm.

There is a phosphor in which, when the wavelength of the excitation light is set to a shorter wavelength side than blue light (bluish purple to near-ultraviolet light), the luminous efficiency improves. For example, as illustrated in FIG. 2 of PTL 6 (Japanese Unexamined Patent Application Publication No. 2007-49114), in the $CaAlSiN_3$:Eu which is used in the red phosphor 18 exemplified in the first embodiment, the excitation efficiency is good at shorter wavelengths than 410 nm. As illustrated in FIGS. 1 to 4 of PTL 7 (Japanese Patent No. 5263722), also in the Eu-doped β SiAlON which is used in the green phosphor 19 exemplified in the first embodiment, the excitation efficiency is good at the short wavelength side.

Since the phosphor is excited by the output light of the LED chip 16C which emits light with a peak wavelength from 350 nm to 410 nm, it is possible to emit red and green more efficiently than by combining the LED chip 16 which has a peak wavelength in the vicinity of 450 nm exemplified in the first embodiment. Most of the light energy which is output from the LED chip 16C is consumed exciting the phosphors 18 and 19, and mainly red light and green light are emitted from the first light source LS1. In contrast, blue around a peak wavelength 445, which is the output light from the LED chip 16D, is emitted from the second light source LS2. However, the color gamut which the second light source LS2 is capable of reproducing using blue is widened by emitting light slightly closer to the short wavelength side than the blue light which has a peak in the vicinity of 450 nm which is exemplified in the first embodiment. When using the LED 22F in a backlight of a liquid crystal display device, the overlap between the light emission spectra of the LED chip 16 and the phosphor 19 of the first light source LS1 is reduced. Accordingly, since the color separation by the color filters of the liquid crystal display panel is improved, it is possible to enlarge the green color gamut. It is also possible to enlarge the total color gamut of blue, green, and red by selecting phosphors which have emission wavelengths which are approximately 1 to 5 nm short as the green phosphor 19.

Therefore, it is possible to use the LED 22F according to the second configuration favorably in a display device in which there is a demand for high color rendering properties.

In addition, the red light and the green light which are emitted from the first light source LS1 are efficiently excited, and the blue light which is output from the second light source LS2 is output without being absorbed by the phosphors. Therefore, it is possible to use the LED 22F according to the second configuration favorably in a display device in which there is a demand for high luminance.

Note that, in the above description, an example is illustrated in which the color gamut is enlarged and the phosphors are efficiently excited using a blue chip which has a peak wavelength around 445 nm as the LED chip 16D of the second light source LS2. However, since the effect of improving the luminous efficiency may be obtained even if the LED chip 16 which emits blue light with a peak wavelength in the range of 430 to 480 nm is used, the wavelength of the LED chip 16D may be selected according to the objective. If light with a peak wavelength around 445 nm, for example, blue light with a peak wavelength in the range of 440 to 450 nm or 430 nm to 450 nm is selected as the blue light to be emitted by the LED chip 16D, the effect of widening the color gamut as described above may be obtained.

[Configuration and Effects of LEDs 22G]

Figure 29:
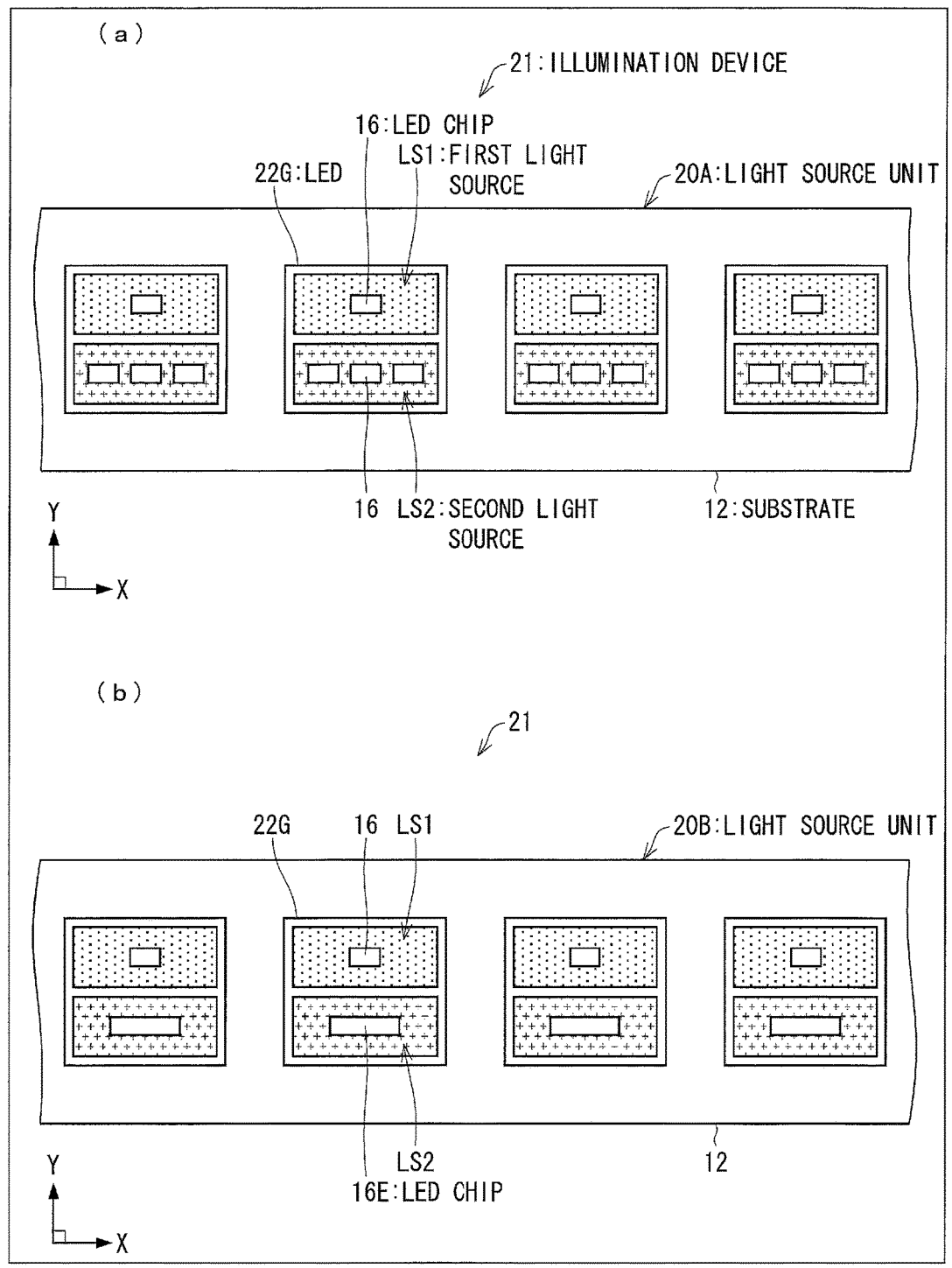
FIG. 29 (a) is a plan view illustrating a portion of a light source unit containing a seventh LED in the illumination device of FIG. 5 in an enlarged manner, and FIG. 29 (b) is a plan view illustrating a portion of a light source unit containing another seventh LED in the illumination device of FIG. 5 in an enlarged manner.

FIG. 29 (a) is a plan view illustrating a portion of another light source unit 20A containing the LEDs 22G (the seventh LED) in the illumination device 21 according to the second embodiment in an enlarged manner. FIG. 29 (b) is a plan view illustrating a portion of a light source unit 20B containing another LED 22G in the illumination device 21 in an enlarged manner.

(First Configuration)

As illustrated in FIG. 29 (a), the light source unit 20A is provided with a plurality of the LEDs 22G according to the first configuration. In the LED 22G, one of the LED chips 16 is installed in the first light source LS1, and a plurality of (in FIG. 29 (a), three) LED chips 16 is installed in the second light source LS2. The plurality of LED chips 16 in the second light source LS2 is disposed to line up in the X direction, and is electrically connected in series. Accordingly, the plurality of LED chips 16 emits light of a luminance corresponding to the number of connections.

(Second Configuration)

As illustrated in FIG. 29 (b), the light source unit 20B is provided with a plurality of the LEDs 22G according to the second configuration. In the LED 22G, one of the LED chips 16 is installed in the first light source LS1, and a one of the LED chips 16 is installed in the second light source LS2. The LED chip 16E is formed such that the long side is longer than in the LED chip 16, and emits light of a luminance corresponding to the length.

(Effects of First and Second Configurations)

In the LEDs 22G according to the first and second configurations which are configured as described above, it is possible to render the light amount of the second light source LS2 greater than the light amount of the first light source LS1. Accordingly, this is effective in cases such as when the toning of the light is performed by changing the light amounts of the first light source LS1 and the second light source LS2.

For example, it is possible to apply the configuration of the LED 22G to the LED 22 F described earlier. Specifically, the first light source LS1 of the LED 22G is applied to the first light source LS1 of the LED 22F, and the second light source LS2 of the LED 22G is applied to the second light source LS2 of the LED 22F.

Accordingly, in the LED 22F, the light intensity of the LED chip 16D is higher than the light intensity of the LED chip 16C. Since the LED chip 16C emits wavelengths at which the phosphors 18 and 19 have good excitation efficiency, the light intensity of the green light and the red light which are mainly output from the first light source LS1 is high. In addition, by increasing the intensity of the blue light which is output from the second light source LS2, the luminance of the white light which is obtained by the color mixing of the light which is emitted from the first light source LS1 and the second light source LS2 is also improved. Therefore, it is possible to realize a luminance improvement in the LED 22F which reduces blue light.

The LED chips 16 or the LED chips 16E in the second light sources LS2 are disposed such that the long sides thereof are parallel to the X direction, that is, the longitudinal direction of the light entrance portion 15a. Accordingly, it is possible to cause the light amounts of the first light source LS1 and the second light source LS2 to differ using the package 23 of the same size as the package 23 in the LEDs 22A to 22F described earlier. Therefore, it is possible to realize regularized light and color mixing without changing the thickness of the light guide plate 15.

[Configuration and Effects of LEDs 22H]

Figure 30:
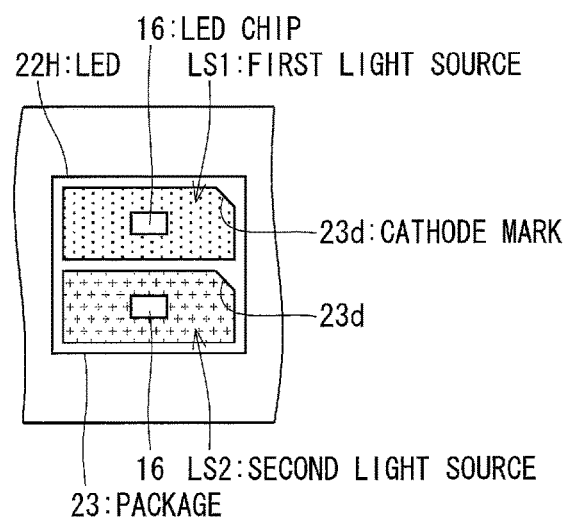
FIG. 30 is a plan view of an eighth LED in the illumination device of FIG. 5.

FIG. 30 is a plan view of the LED 22H (the eighth LED).

As illustrated in FIG. 30, in the LED 22H, the package 23 includes cathode marks 23d. The cathode marks 23d are formed on the same side of a rectangle of the package 23 such that one corner portion of the first light source LS1 and the second light source LS2 in the package 23 is cut out.

Accordingly, when installing the LED 22H on the substrate 12, it is possible to perform positioning such that the LED 22H is disposed in the correct position, using the cathode marks 23d as marks. Therefore, it is possible to correctly install the LED 22H without mistaking the disposition positions of the first light source LS1 and the second light source LS2 which have different luminescent colors.

[Appendix]

Each of the LEDs 22B to 22H described above is configured in one package 23. However, each of the LEDs 22B to 22H may be configured as two individual LEDs, as in the LEDs 13 and 14 in the first embodiment.

Third Embodiment

Description will be given of the third embodiment of the present invention, with reference to FIGS. 4, 14 and 15.

Note that, in the present embodiment, components which have the same function as the components in the first embodiment described earlier will be assigned the same reference symbols, and description thereof will be omitted.
[Configuration of Illumination Device 31]

Figure 14:
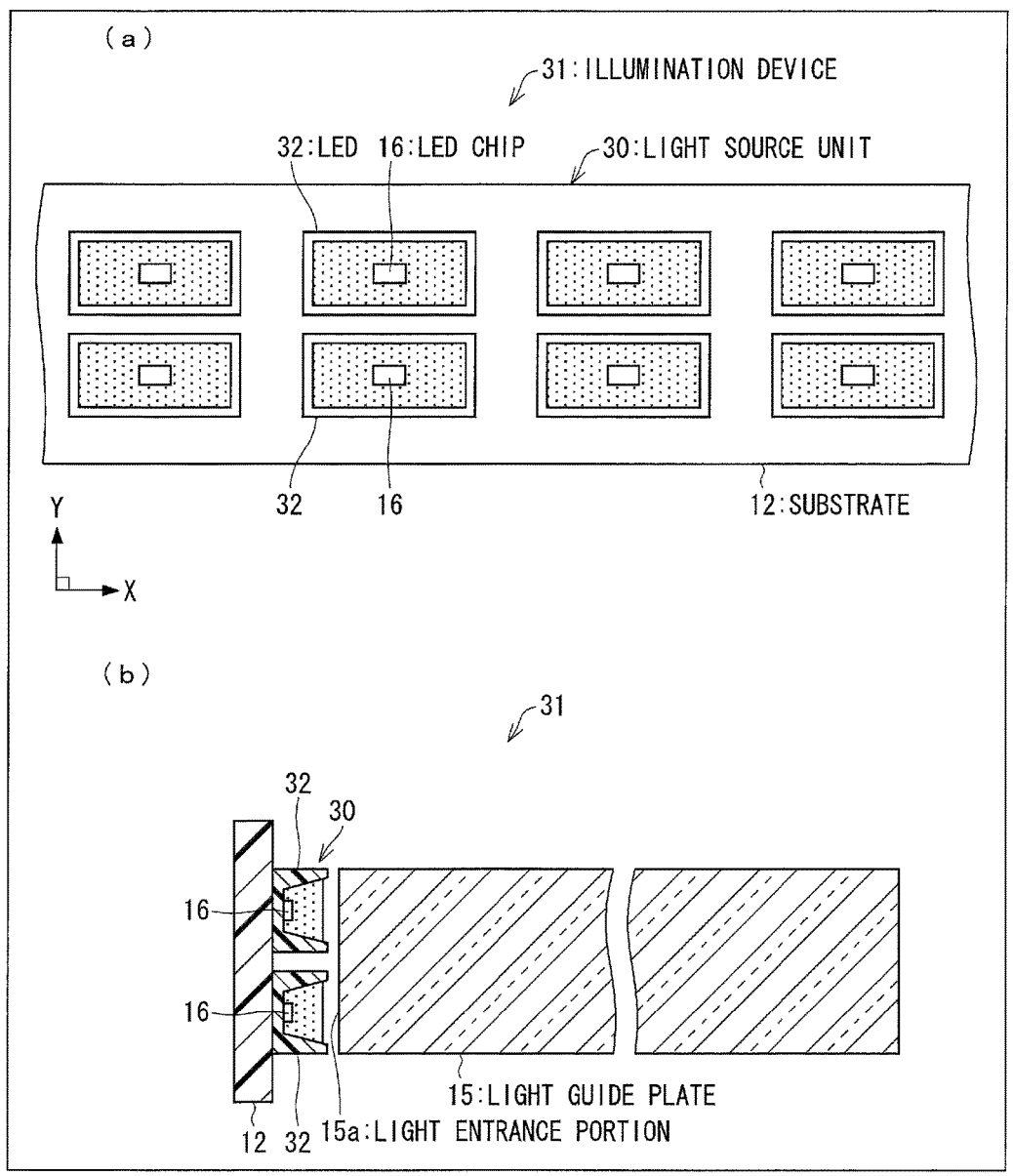
FIG. 14 (a) is a plan view illustrating a portion of a light source unit in an illumination device according to a third embodiment of the present invention in an enlarged manner, and FIG. 14 (b) is a longitudinal sectional diagram of the illumination device.

FIG. 14 (a) is a plan view illustrating a portion of a light source unit 30 in an illumination device 31 according to the third embodiment in an enlarged manner, and FIG. 14 (b) is a longitudinal sectional diagram of the illumination device 31.

As illustrated in FIGS. 14 (a) and 14 (b), the illumination device 31 is provided with the substrate 12, the light guide plate 15, and a plurality of LEDs 32.

The plurality of LEDs 32 is installed on the substrate 12 so as to line up in two rows along the longitudinal direction of the substrate 12. In each of the rows, the LEDs 32 are connected electrically in series, respectively. The LEDs 32 are disposed leaving an interval therebetween such that the respective LED chips 16 line up in a direction (the Y direction) which orthogonally intersects the row direction (the X direction), between the adjacent rows.

The LED chips 16 which are lined up in the same row are electrically connected in series, and form each of the LED circuits 5 and 6 described earlier. Accordingly, in the LED chips 16 which form each row, the applied constant current is controlled individually by the LED drive control unit 1 illustrated in FIG. 4.

The substrate 12 and the LEDs 32 form the light source unit 30. The light emitting surfaces of the LEDs 32 face the light entrance portion 15a, and the light source unit 30 is disposed in a position in the vicinity of the light guide plate 15 such that the emitted light from the respective LED chips 16 of the LEDs 32 enters the light entrance portion 15a of the light guide plate 15.
[Configuration of LEDs 32]

Figure 15:
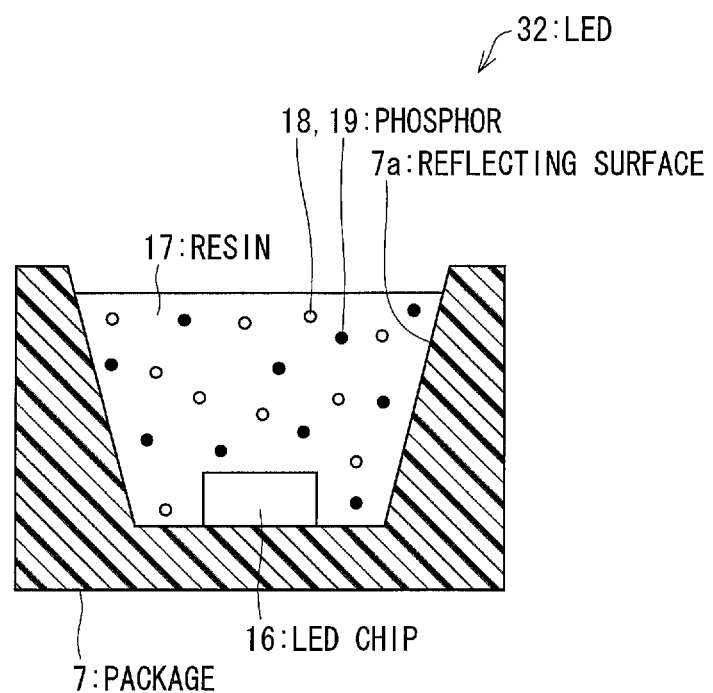
FIG. 15 is a longitudinal sectional diagram of an LED in the illumination device of FIG. 14.

FIG. 15 is a longitudinal sectional diagram of the LED 32 in the illumination device 31.

As illustrated in FIG. 14 (a), in the LED 32, the light emitting surface is rectangular, and the LED chip 16 is installed in the center. As illustrated in FIG. 15, the LED 32 includes the package 7, the LED chip 16, the resin 17, and the phosphors 18 and 19.

Unlike the LEDs 13 and 14 in the first embodiment, in the LED 32, the phosphors 18 and 19 are dispersed in the resin 17 with which both of the concave portions in the package 7 are filled.

In the LED 32 which is configured as described above, as the primary light (the blue light) which is emitted from the LED chip 16 passes through the resin 17, a portion of the primary light excites the phosphors 18 and 19 and is converted into the secondary light (the red light and the green light). In this manner, white light is radiated from the LED 13 to the outside due to the color mixing of the blue primary light and the red and green secondary lights.

Note that, in the LED 32, the blue LED chip 16, the red phosphor 18, and the green phosphor 19 are combined; however, the combination is not limited thereto. For example, the LED 32 may be configured by combining the blue LED chip 16 and the yellow phosphor, and it is possible to obtain a pseudo-luminescent color.
[Effects of Illumination Device 31]

Figure 23:
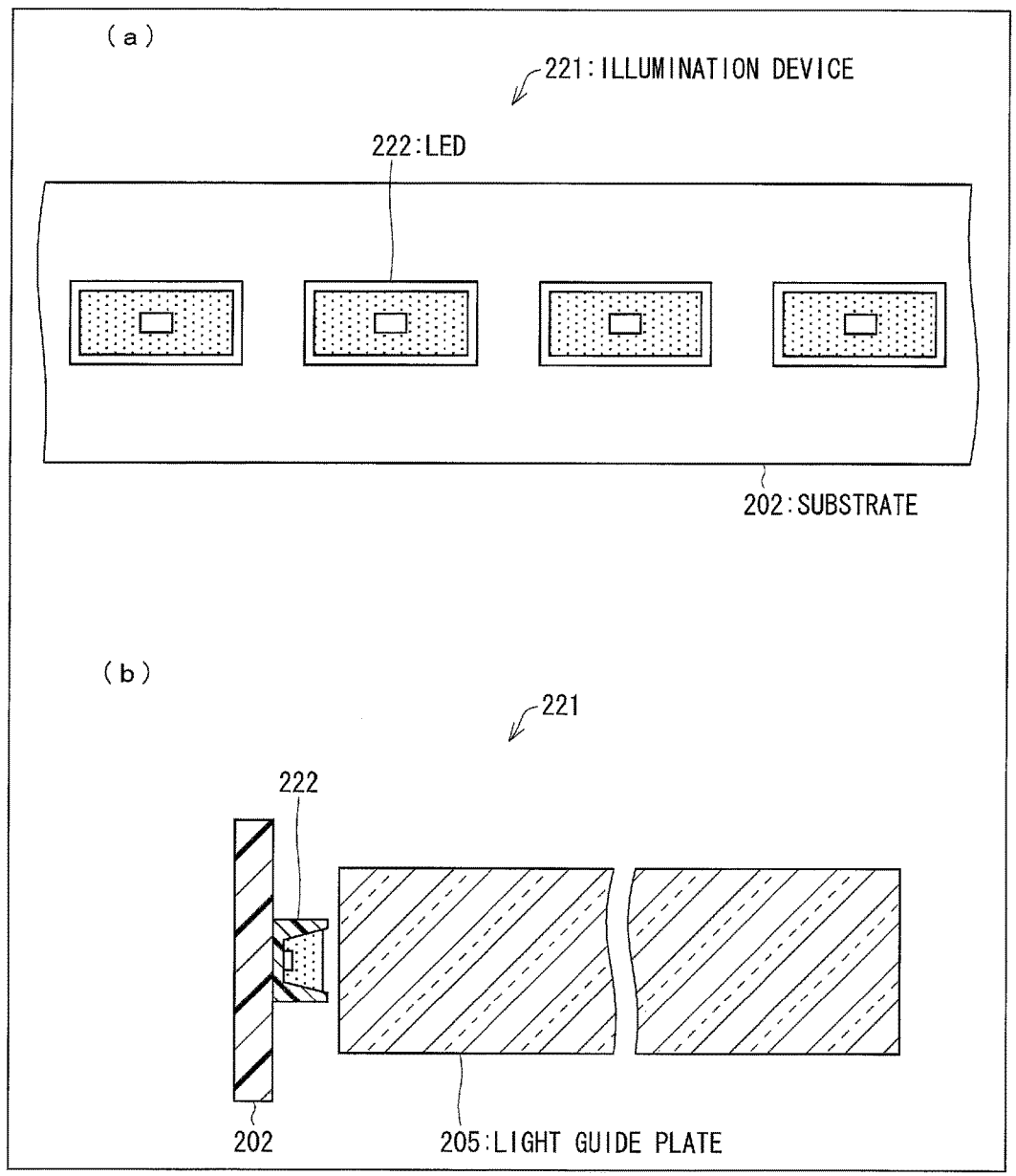
FIG. 23 (a) is a front view illustrating a portion of an illumination device of the related art which uses LEDs with the same luminescent colors in an enlarged manner, and FIG. 23 (b) is a plan view illustrating a portion of a light source unit in the illumination device in an enlarged manner.
Figure 24:
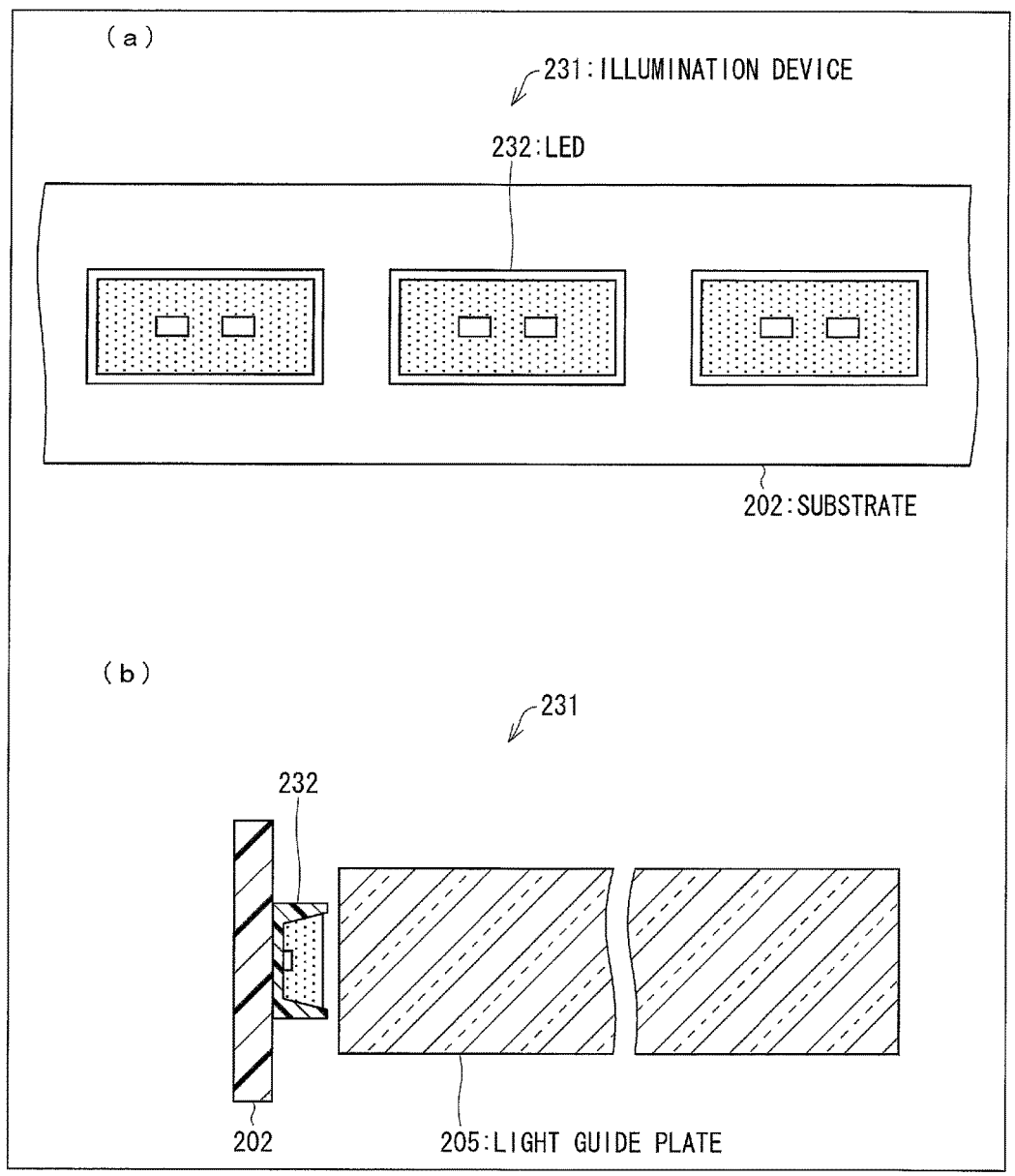
FIG. 24 (a) is a front view illustrating a portion of still another illumination device of the related art which uses LEDs with the same luminescent colors in an enlarged manner, and FIG. 24 (b) is a plan view illustrating a portion of a light source unit in the illumination device in an enlarged manner.

As described above, the illumination device 31 of the present embodiment is provided with the light source unit 30 in which the LEDs 32 of the same color are installed on the substrate 12 to form two rows. In the light source unit 30, the LEDs 32 are disposed such that, between each of the rows, the LED chips 16 line up in a direction (the Y direction) which orthogonally intersects the row direction (the X direction). In this manner, since the LED chips 16 which are the light emission points of each of the LEDs 32 are lined up in the direction which orthogonally intersects the row, the light amount of the incident light in regard to the width direction of the light entrance portion 15a of the light guide plate 15 increases to double in comparison to the configuration (the LEDs 222 being disposed in one row) of the related art illustrated in FIG. 23. Accordingly, it is possible to increase the light intensity which is obtained from the light guide plate 15.

Since the LEDs 32 independently house the LED chips 16, it is possible to prevent the mutual absorption of the light between the LED chips 16 from occurring. Accordingly, it is possible to suppress a reduction in the luminous efficiency of the LEDs 32.

Since the shape of the light emitting surface of the LED 32 is rectangular and the longitudinal direction of the light emitting surface and the longitudinal direction of the substrate 12 are the same direction, it is possible to line up the LEDs 32 on the elongated substrate 12 in the width direction of the substrate 12. According to this shape, the directional characteristics of the LEDs 32 are wide in the long side direction of the light emitting surfaces of the LEDs 32, and the characteristics are narrow in the short side direction. Accordingly, since the light into the light entrance portion 15a is incident constrained in relation to the width direction of the light entrance portion 15a, the light entrance properties to the light guide plate 15 are improved.

In the LED 32, since the blue LED chip 16, the red phosphor 18, and the green phosphor 19 are combined, it is possible to obtain white light with favorable color rendering properties (color reproduction properties). In addition, it is possible to generate light of an arbitrary chromaticity on the chromaticity coordinates according to the compounding ratio of the phosphors 18 and 19.

Fourth Embodiment

Description will be given of the fourth embodiment of the present invention, with reference to FIGS. 4, 16 and 17.

Note that, in the present embodiment, components which have the same function as the components in the first to third embodiments described earlier will be assigned the same reference symbols, and description thereof will be omitted.
[Configuration of Illumination Device 41]

Figure 16:
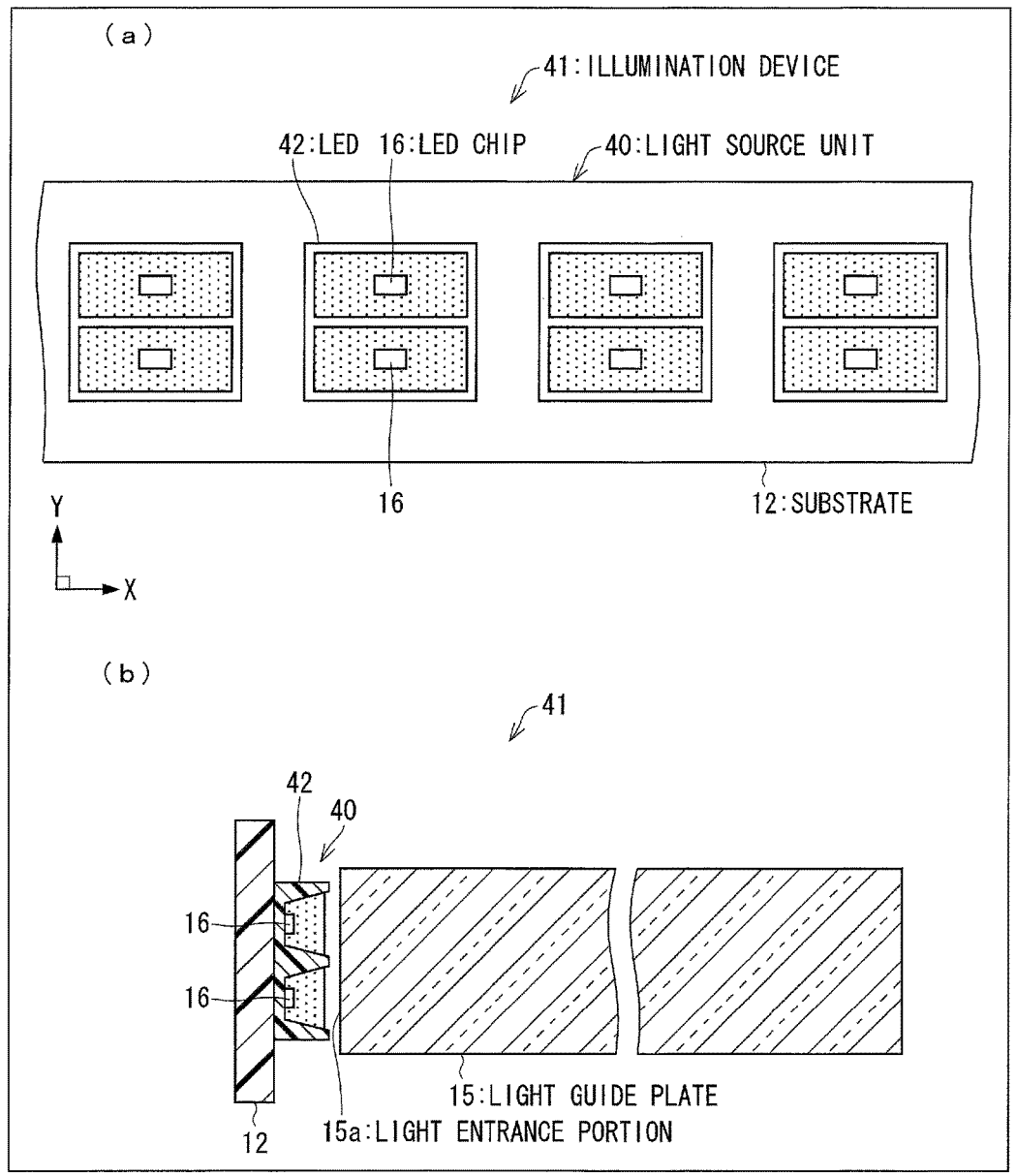
FIG. 16 (a) is a plan view illustrating a portion of a light source unit in an illumination device according to a fourth embodiment of the present invention in an enlarged manner, and FIG. 16 (b) is a longitudinal sectional diagram of the illumination device.

FIG. 16 (a) is a plan view illustrating a portion of a light source unit 40 in the illumination device 41 according to the fourth embodiment in an enlarged manner, and FIG. 16 (b) is a longitudinal sectional diagram of the illumination device 41.

As illustrated in FIGS. 16 (a) and 16 (b), the illumination device 41 is provided with the substrate 12, the light guide plate 15, and a plurality of LEDs 42.

The plurality of LEDs 42 is installed on the substrate 12 so as to line up in a row along the longitudinal direction (the X direction) of the substrate 12. The LED 42 includes two of the LED chips 16 which are disposed to leave an interval therebetween.

In the LEDs 42, one of the LED chips 16 of each of the LEDs 42 lines up in a row along the X direction, and the other LED chips 16 are disposed to line up in a row along the X direction. In the LEDs 42, the two LED chips 16 are disposed leaving an interval therebetween such that the two LED chips 16 line up in a direction (the Y direction) which orthogonally intersects the row direction (the X direction), between the adjacent rows.

The LED chips 16 which are lined up in the same row are electrically connected in series, and form each of the LED circuits 5 and 6 described earlier. Accordingly, in the LED chips 16 which form each row, the applied constant current is controlled individually by the LED drive control unit 1 illustrated in FIG. 4.

The substrate 12 and the LEDs 42 form the light source unit 40. The light emitting surfaces of the LEDs 42 face the light entrance portion 15a, and the light source unit 40 is disposed in a position in the vicinity of the light guide plate 15 such that the emitted light from each of the two LED chips 16 in the LEDs 42 enters the light entrance portion 15a of the light guide plate 15.

[Configuration of LEDs 42]

Figure 17:
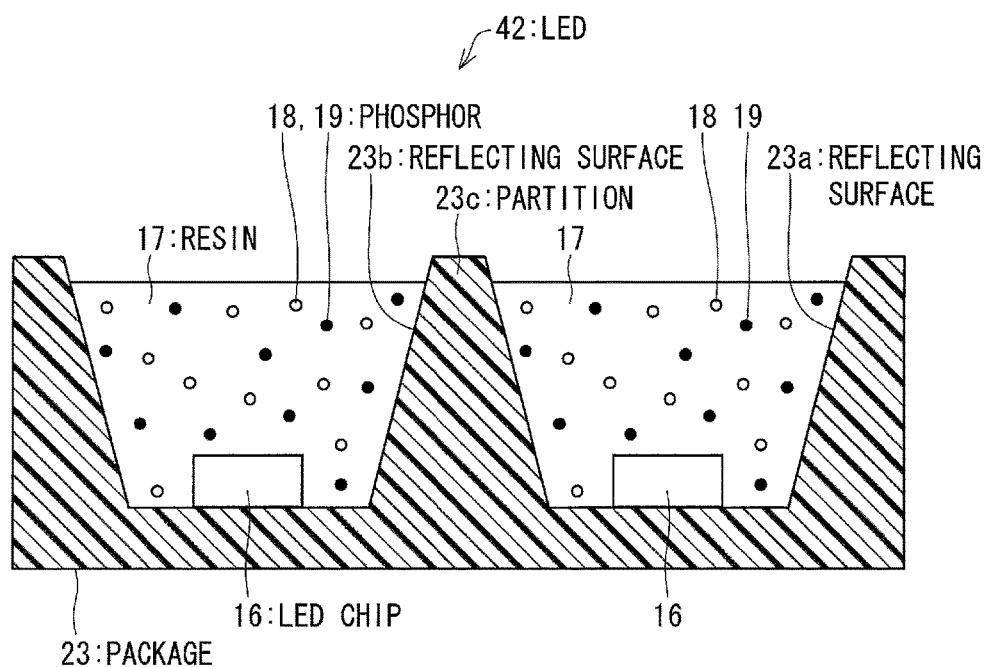
FIG. 17 is a longitudinal sectional diagram of an LED in the illumination device of FIG. 16.

FIG. 17 is a longitudinal sectional diagram of the LED 42 in the illumination device 41.

The LED 42 includes the package 23, the two LED chips 16, the resin 17, and the phosphors 18 and 19.

Unlike the LED 22C of the second embodiment, in the LED 42, the phosphors 18 and 19 are dispersed in the resin 17 with which one of the concave portions in the package 23 is filled, in addition to the resin 17 with which the other concave portion is filled.

Note that, in the LED 42, in the same manner as the LED 32 in the third embodiment, the blue LED chip 16, the red phosphor 18, and the green phosphor 19 are combined; however, the combination is not limited thereto. For example, the LED 42 may be configured by combining the blue LED chip 16 and the yellow phosphor.

[Effects of Illumination Device 41]

As described above, the illumination device 41 of the present embodiment is provided with the light source unit 40 in which the LEDs 42 which emit light of the same luminescent color are installed on the substrate 12 to form rows. In the light source unit 40, the LEDs 42 are disposed such that, between the rows formed by the two LED chips 16 along the longitudinal direction of the substrate 12, the LED chips 16 line up in a direction (the Y direction) which orthogonally intersects the row direction (the X direction). In this manner, the two LED chips 16 which are the light emission points of the LEDs 42 are lined up in the direction which orthogonally intersects the row. Accordingly, the light amount of the incident light in regard to the width direction of the light entrance portion 15a of the light guide plate 15 increases to double in comparison to the configuration (the LEDs 222 being disposed in one row) of the related art illustrated in FIG. 23. Accordingly, it is possible to increase the light intensity which is obtained from the light guide plate 15.

Since the LEDs 42 independently house the LED chips 16, it is possible to prevent the mutual absorption of the light between the LED chips 16 from occurring. Accordingly, it is possible to suppress a reduction in the luminous efficiency of the LEDs 42.

Since the LED chips 16 are stored (sealed) in the single package 23, it is possible to narrow the installation width of the LED 42 on the substrate 12. Accordingly, it is possible to narrow the width of the light entrance portion 15a which is determined according to the installation width, and to form the light guide plate 15 long and thin. In addition, the two LED chips 16 are installed on the substrate 12 at once by installing one of the LEDs 42 on the substrate 12. Accordingly, in the illumination device 41, since the workload of assembling the LED into the substrate 12 is reduced in comparison to the illumination device 31 of the third embodiment, it is possible to reduce the manufacturing cost of the illumination device 41.

Since the shape of the light emitting surface of the LED 42 is rectangular and the longitudinal direction of the light emitting surface and the longitudinal direction of the substrate 12 are the same direction, it is possible to line up the LEDs 42 on the elongated substrate 12 in the width direction of the substrate 12. According to this shape, the directional characteristics of the LEDs 42 are wide in the long side direction of each of the light emitting surfaces of the LEDs 42, and the characteristics are narrow in the short side direction. Accordingly, since the light into the light entrance portion 15a is incident constrained in relation to the width direction of the light entrance portion 15a, the light entrance properties to the light guide plate 15 are improved.

In the LED 42, in the same manner as the LED 32 in the third embodiment, since the blue LED chip 16, the red phosphor 18, and the green phosphor 19 are combined, it is possible to obtain white light with favorable color rendering properties (color reproduction properties). In addition, it is possible to generate light of an arbitrary chromaticity on the chromaticity coordinates according to the compounding ratio of the phosphors 18 and 19.

Fifth Embodiment

Description will be given of the fifth embodiment of the present invention, with reference to FIGS. 4 and 18.

Note that, in the present embodiment, components which have the same function as the components in the first to fourth embodiments described earlier will be assigned the same reference symbols, and description thereof will be omitted.

[Configuration of Illumination Device 51]

Figure 18:
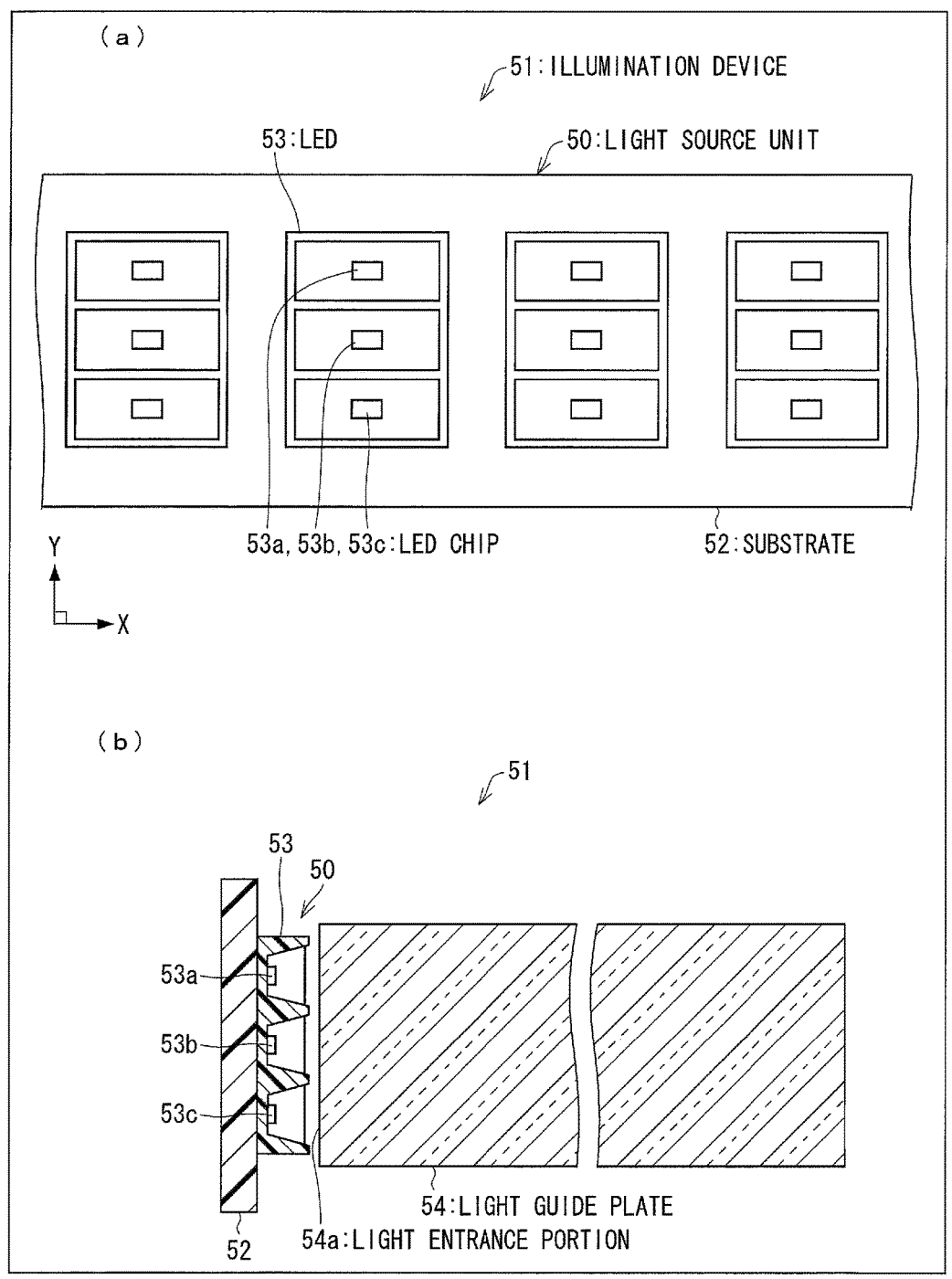
FIG. 18 (a) is a plan view illustrating a portion of a light source unit in an illumination device according to a fifth embodiment of the present invention in an enlarged manner, and FIG. 18 (b) is a longitudinal sectional diagram of the illumination device.

FIG. 18 (a) is a plan view illustrating a portion of a light source unit 50 in an illumination device 51 according to the fifth embodiment in an enlarged manner, and FIG. 18 (b) is a longitudinal sectional diagram of the illumination device 51.

As illustrated in FIGS. 18 (a) and 18 (b), the illumination device 51 is provided with a substrate 52, LEDs 53, and a light guide plate 54.

Although the light guide plate 54 has the same function as the light guide plate 15 of the first embodiment, the thickness is formed thicker than the light guide plate 15 such that the light of three LED chips 53a, 53b, and 53c of the LED 53 described later can enter.

The substrate 52 is formed to be an elongated rectangle shape (rectangular), and has enough width that it is possible to dispose the LEDs 53 to line up in the width direction of the substrate 52. In the substrate 52, printed wiring (not shown) for supplying power to the LEDs 53 is formed on an installation surface to which the LEDs 53 are installed. A positive terminal and a negative terminal (not shown) which are connected to the printed wiring are formed on both end portions or one end portion of the substrate 52. Power is supplied to the LEDs 53 due to a wiring for supplying power from outside being connected to the positive terminal and the negative terminal.

The plurality of LEDs 53 is installed on the substrate 52 so as to line up in a row along the longitudinal direction (the X direction) of the substrate 52. The LED 53 includes the three LED chips 53a, 53b, and 53c which are disposed to leave an interval therebetween.

In the LEDs 53, each of the LED chips 53a, 53b, and 53c of each of the LEDs 53 is disposed to line up in a row along the X direction. In the LEDs 53, the LED chips 53a, 53b, and 53c are disposed leaving an interval therebetween such that the respective LED chips 53a, 53b, and 53c line up in a direction (the Y direction) which orthogonally intersects the row direction (the X direction), between the adjacent rows.

The LED chips 53a, 53b and 53c which are lined up in the same row are electrically connected in series respectively, and form each of the LED circuits 5 and 6 described earlier. Accordingly, in the LED chips 16 which form each row, the applied constant current is controlled individually by the LED drive control unit 1 illustrated in FIG. 4.

The substrate 52 and the LEDs 53 form the light source unit 50. The light emitting surfaces of the LEDs 53 face the light entrance portion 54a, and the light source unit 50 is disposed in a position in the vicinity of the light guide plate 54 such that the emitted light from each of the three LED chips 53a, 53b, and 53c in the LEDs 53 enters the light entrance portion 54a of the light guide plate 54.

[Configuration of LEDs 53]

Unlike the package 23 of the LED 22 in the second embodiment, the LED 53 includes three concave surface portions, and the LED chips 53a, 53b, and 53c are installed on the bottom surface of the respective concave surface portions. Although the concave portions formed by each of the concave surface portions is filled with a resin which is the same as the resin 17, no phosphors are dispersed in the resin.

The LED chip 53a is a red LED chip, the LED chip 53b is a green LED chip, and the LED chip 53c is a blue LED chip.

[Effects of Illumination Device 51]

As described above, the illumination device 51 of the present embodiment is provided with the light source unit 50 in which the LEDs 53 which emit light of different luminescent colors are installed on the substrate 52 to form a row. In the light source unit 50, the LEDs 53 are disposed such that, between the rows formed by the three LED chips 53a, 53b, and 53c along the longitudinal direction of the substrate 52, the LED chips 53a, 53b, and 53c line up in a direction (the Y direction) which orthogonally intersects the row direction (the X direction). In this manner, the three LED chips 53a, 53b, and 53c which are the light emission points of the LEDs 53 are lined up in the direction which orthogonally intersects the row. Accordingly, since the three light emission points are in the vicinity of each other, the color mixing properties of the emitted light from each of the LEDs 22 are improved. It is possible to obtain white light by mixing the three colors red, green, and blue. In addition, it is possible to obtain an arbitrary intermediate color by using the LED drive control unit 1 illustrated in FIG. 4 to control the constant currents which are applied to the three LED chips 53a, 53b, and 53c in the LEDs 53 and adjusting the light intensity of each of the LED chips 53a, 53b, and 53c.

Since the LEDs 53 independently house the LED chips 53a, 53b, and 53c, it is possible to prevent the mutual absorption of the light between the LED chips 53a, 53b, and 53c from occurring. Accordingly, it is possible to suppress a reduction in the luminous efficiency of the LEDs 53.

Since the LED chips 53a, 53b, and 53c are stored (sealed) in the single package, it is possible to narrow the installation width of the LED 53 on the substrate 52. Accordingly, it is possible to narrow the width of the light entrance portion 54a which is determined according to the installation width, and to form the light guide plate 54 long and thin. In addition, the three LED chips 53a, 53b, and 53c are installed on the substrate 52 at once by installing one of the LEDs 53 on the substrate 52. Accordingly, in the illumination device 51, since the workload of assembling the LED into the substrate 52 is reduced in comparison to the workload of a case in which three LEDs are individually assembled, it is possible to reduce the manufacturing cost of the illumination device 51.

Since the shape of the light emitting surface of the LED 53 is rectangular and the longitudinal direction of the light emitting surface and the longitudinal direction of the substrate 12 are the same direction, it is possible to line up the LEDs 53 on the elongated substrate 52 in the width direction of the substrate 52. According to this shape, the directional characteristics of the LEDs 53 are wide in the long side direction of each of the light emitting surfaces of the LEDs 53, and the characteristics are narrow in the short side direction. Accordingly, since the light into the light entrance portion 54a is incident constrained in relation to the width direction of the light entrance portion 54a, the light entrance properties to the light guide plate 54 are improved.

Note that, although the LED 53 includes the LED chips 53a, 53b, and 53c with different luminescent colors, instead, the LED 53 may include the LED chips 16 of the same color and use various phosphors. Accordingly, in comparison to the light source units 30 and 40 in the third and fourth embodiments, it is possible to further increase the emitted light amount of the light source unit 50.

Note that, although the illumination device 51 includes the LEDs 53 which include the three LED chips 53a, 53b, and 53c, the LED 53 may include 4 or more LEDs.

In the illumination device 51 which is provided with the LEDs 53 which contain the three LED chips (the red LED chip 53a, the green LED chip 53b, and the blue LED chip 53c), a blue LED chip with a peak wavelength from 460 nm to 500 nm may be used as the blue LED chip 53c. Accordingly, the main blue component of the white light which is obtained from the LED 53 is the blue light which is emitted from the LED chip 53c. Since the influence of the blue light on the retina of a human eye is small, it is possible to reduce the blue light. Therefore, it is possible to use the LED 53 according to the present embodiment favorably in the illumination equipment and the display device.

Sixth Embodiment

Description will be given of the sixth embodiment of the present invention, with reference to FIG. 19.

Note that, in the present embodiment, components which have the same function as the components in the first to fifth embodiments described earlier will be assigned the same reference symbols, and description thereof will be omitted.

Figure 19:
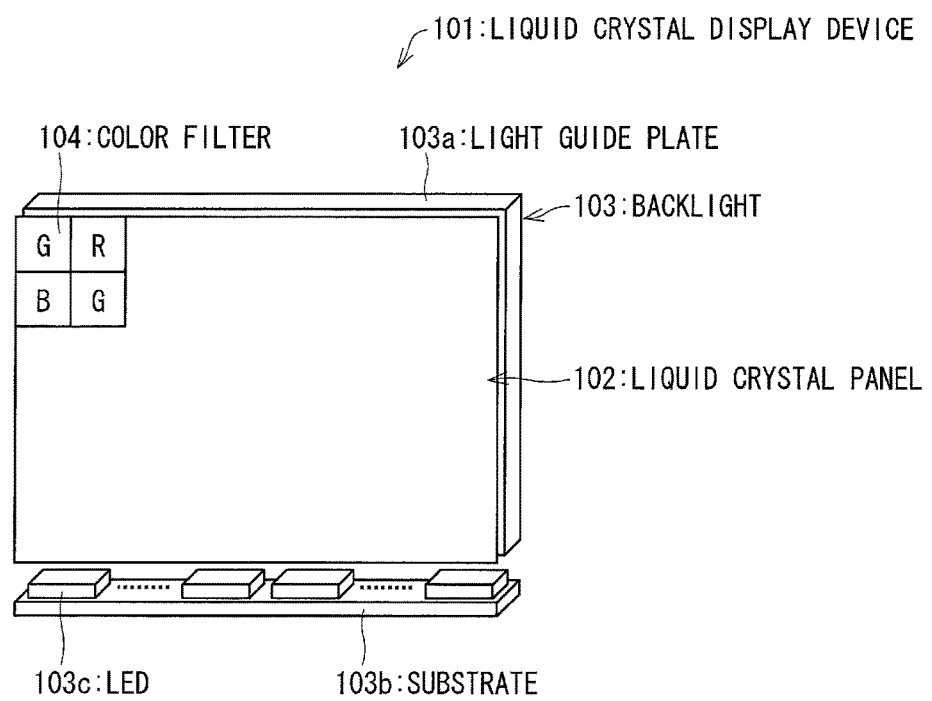
FIG. 19 is a perspective view of a liquid crystal display device according to a sixth embodiment of the present invention.

FIG. 19 is a perspective view illustrating the overall configuration of a liquid crystal display device 101 according to the present embodiment.

As illustrated in FIG. 19, the liquid crystal display device 101 is provided with a liquid crystal panel 102 and a backlight 103.

In the liquid crystal panel 102, the space between two opposing transparent substrates is filled with liquid crystal, and the transmittance of the light from the backlight 103 is changed by changing the orientation state of the liquid crystal in units of pixels which are formed in a matrix. The liquid crystal panel 102 includes a color filter 104 which is disposed on the display surface side. In the color filter 104, filters for each color of red (R), green (G), and blue (B) are formed for each of three sub-pixels which form each pixel. It is possible to emit light of the color of each filter due to the light passing thorough each of the filters. In the liquid crystal panel 102, each pixel is displayed with the color to be displayed due to the transmittance of the liquid crystal layer corresponding to the sub-pixels being individually adjusted based on a light color component ratio of red (R), green (G), and blue (B) corresponding to the color of each pixel which is determined for each display image.

The backlight 103 (the illumination device) is disposed on the rear side of the liquid crystal panel 102, and is an edge light backlight which radiates light onto the entire surface of the liquid crystal panel 102. The backlight 103 includes a light guide plate 103a, a substrate 103b, and a plurality of LEDs 103c. In the substrate 103b, the LEDs 103c are installed to form a line, and the substrate 103b is disposed in the vicinity of the light guide plate 103a in a state in which the light emitting surfaces of the LEDs 103c face the light entrance portion such that the light enters the light entrance portion of one side of the light guide plate 103a.

It is possible to use any of the illumination devices 11, 21, 31, 41, or 51 of the corresponding first to fifth embodiments described earlier as the backlight 103. Accordingly, it is possible to obtain an improvement in the display grade using the excellent characteristics of the illumination devices 11, 21, 31, 41, and 51.

Seventh Embodiment

Description will be given of the seventh embodiment of the present invention, with reference to FIG. 20.

Note that, in the present embodiment, components which have the same function as the components in the first to fifth embodiments described earlier will be assigned the same reference symbols, and description thereof will be omitted.

Figure 20:
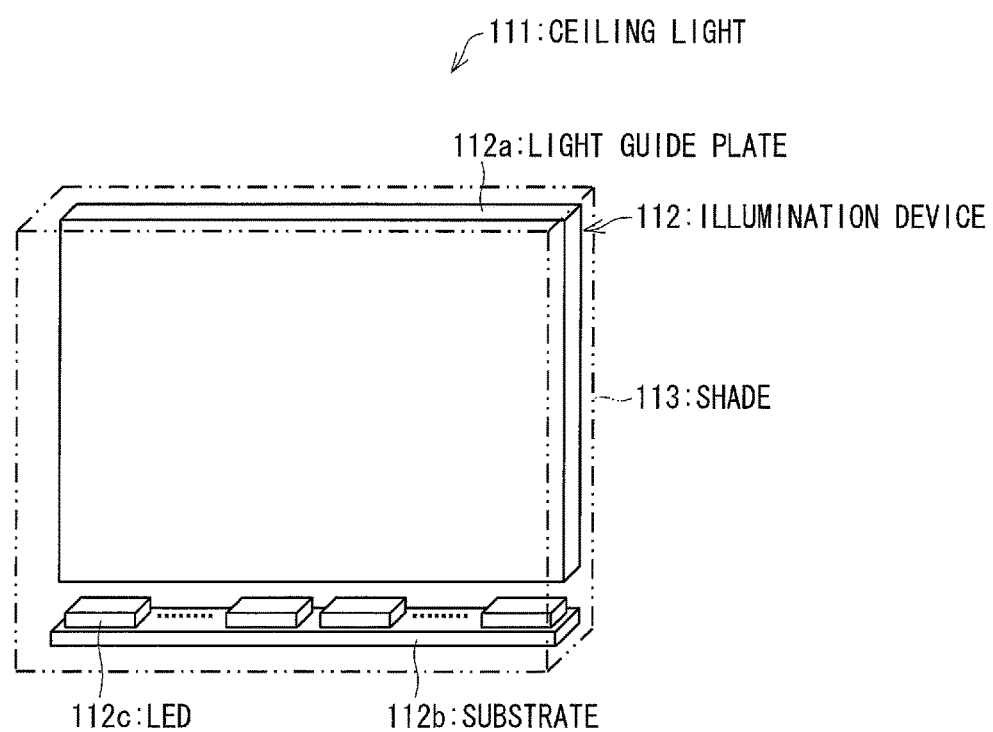
FIG. 20 is a perspective view of a ceiling light according to a seventh embodiment of the present invention.

FIG. 20 is a perspective view illustrating the overall configuration of a ceiling light 111 display device according to the present embodiment.

As illustrated in FIG. 20, the ceiling light 111 (the illumination equipment) is provided with an illumination device 112 and a shade 113.

The shade 113 is a cover which covers the illumination device 112.

The illumination device 112 is the light emitting portion in the ceiling light 111. The illumination device 112 includes a light guide plate 112a, a substrate 112b, and a plurality of LEDs 112c. In the substrate 112b, the LEDs 112c are installed to form a line, and the substrate 112b is disposed in the vicinity of the light guide plate 112a in a state in which the light emitting surfaces of the LEDs 112c face the light entrance portion such that the light enters the light entrance portion of one side of the light guide plate 112a.

It is possible to use any of the illumination devices 11, 21, 31, 41, or 51 of the corresponding first to fifth embodiments described earlier as the illumination device 112. Accordingly, it is possible to obtain an improvement in the illumination efficiency or the like using the excellent characteristics of the illumination devices 11, 21, 31, 41, and 51.

Note that, since the rectangular light guide plate 112a is used, the ceiling light 111 is formed in a rectangular shape; however, as disclosed in PTL 3, it is also possible to form the ceiling light 111 in a circular shape by using a circular light guide plate.

Eighth Embodiment

In the present embodiment, description will be given of phosphors which can be used in each of the embodiments described earlier.

(First Phosphor Group)

The first phosphor group according to the present embodiment can be used in the red phosphors 18 and 18A which are each a red phosphor, and are used in each of the LEDs in the first to seventh embodiments. For example, it is possible to use the first phosphor group favorably in the phosphors 18 and 18A which are used in the LEDs 13, 22A to 22F, 32, and 42 described earlier. In particular, the first red phosphor group is always used in the phosphor 18A of the LED 22E (the second and third configurations).

Hereinafter, description will be given of the details of the red phosphor. Each phosphor of the first phosphor group according to the present embodiment is a compound fluoride phosphor which is doped with $Mn^{4+}$ which emits red light by forbidden transition, for example, a substance illustrated below in (1) to (8) is exemplified.

$$A_2[MF_5]:Mn^{4+} \quad (1)$$

A is selected from a Li, Na, K, Rb, Cs, $NH_4$, and combinations thereof, and M is selected from Al, Ga, In, and combinations thereof.

$$A_3[MF_6]:Mn^{4+} \quad (2)$$

A is selected from a Li, Na, K, Rb, Cs, $NH_4$, and combinations thereof, and M is selected from Al, Ga, In, and combinations thereof.

$$Zn_2[MF_7]:Mn^{4+} \quad (3)$$

M is selected from Al, Ga, In, and combinations thereof.

$$A[In_2F_7]:Mn^{4+} \quad (4)$$

A is selected from a Li, Na, K, Rb, Cs, $NH_4$, and combinations thereof.

$$A_2[MF_6]:Mn^{4+} \quad (5)$$

A is selected from a Li, Na, K, Rb, Cs, $NH^4$, and combinations thereof, and M is selected from Ge, Si, Sn, Ti, Zr, and combinations thereof.

$$E[MF_6]:Mn^{4+} \quad (6)$$

E is selected from Mg, Ca, Sr, Ba, Zn, and combinations thereof, and M is selected from Ge, Si, Sn, Ti, Zr, and combinations thereof.

$$Ba_{0.65}Zr_{0.35}F_{2.70}:Mn^{4+} \quad (7)$$

$$A_3[ZrF_7]:Mn^{4+} \quad (8)$$

A is selected from Li, Na, K, Rb, Cs, $NH_4$, and combinations thereof.

(Second Phosphor Group)

The second phosphor group according to the present embodiment can be used in the red phosphors 18 and 18A and the green phosphors 19 and 19A which are each a combination of a red phosphor and a green phosphor, and are used in each of the LEDs in the first to seventh embodiments. For example, it is possible to use the second phosphor group favorably in the red phosphors 18 and 18A and the green phosphors 19 and 19A which are used in the LEDs 13, 22C to 22E, 22F, 32, and 42 described earlier.

As the green phosphor, at least one species is contained which is selected from a divalent europium-doped oxynitride phosphor, which is (A) β SiAlON described below and (B) divalent europium-doped silicate phosphor, and as the red phosphor, at least one type is contained which is selected from the following two types (C), (D) tetravalent manganese-doped tetravalent metal salt fluoride phosphor.

The combination ratio between the green phosphor and the red phosphor is not particularly limited; however, it is preferable to mix the green phosphor with the red phosphor at a combination ratio in the range of 5 to 70% by weight ratio, and it is more preferable to mix at a combination ratio in the range of 15 to 45%.

Particularly favorable as combinations with the blue LED chip 16 described earlier are a combination of a β SiAlON green phosphor and a KSF-based red phosphor, and a combination of a BOS (Bariumortho-Silicate)-based green phosphor and a KSF-based red phosphor.

Divalent europium-doped oxynitride green phosphor, which is (A) β SiAlON.

The divalent europium-doped oxynitride green phosphor is actually represented by the following general formula.

$$Eu_aSi_bAl_cO_dN_e \qquad (A)$$

Hereinafter, the divalent europium-doped oxynitride green phosphor will be referred to as a "first green phosphor".

In general formula (A), Eu represents europium, Si represents silicon, Al represents aluminum, O represents oxygen, and N represents nitrogen. In general formula (A), the value of a representing the composition ratio (the concentration) of Eu is $0.005 \leq a \leq 0.4$. When the value of a is less than 0.005, sufficient brightness may not be obtained, and when the value of a exceeds 0.4, the brightness greatly decreases due to concentration quenching or the like, and thus, such ranges are not suitable as values of a.

Note that, from the perspective of stability of powder characteristics and homogeneity of the parent, it is preferable that the value of a in the general formula (A) is $0.01 \leq a \leq 0.2$. In general formula (A), b which represents the composition ratio (the concentration) of Si, and c which represents the composition ratio (the concentration) of Al, are numbers which satisfy b+c=12, and d which represents the composition ratio (the concentration) of O, and e which represents the composition ratio (the concentration) of N, are numbers which satisfy d+e=16.

As the first green phosphor, specifically, it is possible to exemplify phosphors which are formed at the composition ratios of the following examples (A-1) to (A-6).

| | |
|---|---|
| Eu: 0.05, Si: 11.50, Al: 0.50, O: 0.05, N: 15.95 | (A-1) |
| Eu: 0.10, Si: 11.00, Al: 1.00, O: 0.10, N: 15.90 | (A-2) |
| Eu: 0.30, Si: 9.80, Al: 2.20, O: 0.30, N: 15.70 | (A-3) |
| Eu: 0.15, Si: 10.00, Al: 2.00, O: 0.20, N: 15.80 | (A-4) |
| Eu: 0.01, Si: 11.60, Al: 0.40, O: 0.01, N: 15.99 | (A-5) |
| Eu: 0.005, Si: 11.70, Al: 0.30, O: 0.03, N: 15.97 | (A-6) |

The first green phosphor is not limited to the examples described above, and may be a phosphor which is formed using another composition ratio which satisfies the above conditions of the values a, b, c, d, and e.

(B) Divalent Europium-Doped Silicate Phosphor

The divalent europium-doped silicate phosphor is actually represented by the following general formula.

$$2(Ba_{1-f-g}MI_fEu_g)O \cdot SiO_2 \qquad (B)$$

Hereinafter, the divalent europium-doped silicate phosphor will be referred to as a "second green phosphor".

In general formula (B), Ba represents barium, Eu represents europium, O represents oxygen, and Si represents silicon. In the general formula (B), MI indicates an alkaline earth metal element of at least one species selected from Mg, Ca, and Sr, and it is preferable for MI to be Sr in order to obtain a high efficiency parent.

In general formula (B), a value representing the composition ratio (the concentration) of MI is $0 \leq f \leq 0.55$. Due to the value of f being within this range, it is possible to obtain green light in the range of 510 to 540 nm. When the value of f exceeds 0.55, a yellowish green light is obtained, and the color purity is degraded. Furthermore, from the perspective of efficiency and color purity, it is preferable for the value of f to be within the range $0.15 \leq f \leq 0.45$.

In general formula (B), the value of g representing the composition ratio (the concentration) of Eu is $0.03 \leq g \leq 0.10$. When the value of g is less than 0.03, sufficient brightness may not be obtained, and when the value of g exceeds 0.10, the brightness greatly decreases due to concentration quenching or the like, and thus, such ranges are not suitable as values of g.

Note that, from the perspective of brightness and stability of powder characteristics, it is preferable that the value of g is within the range of $0.04 \leq g \leq 0.08$.

As the second green phosphor, specifically, it is possible to exemplify phosphors which are formed at the composition of the following examples (B-1) to (B-13).

| | |
|---|---|
| $2(Ba_{0.70}Sr_{0.26}Eu_{0.04}) \cdot SiO_2$ | (B-1) |
| $2(Ba_{0.57}Sr_{0.38}Eu_{0.05})O \cdot SiO_2$ | (B-2) |
| $2(Ba_{0.53}Sr_{0.43}Eu_{0.04})O \cdot SiO_2$ | (B-3) |
| $2(Ba_{0.82}Sr_{0.15}Eu_{0.03})O \cdot SiO_2$ | (B-4) |
| $2(Ba_{0.46}Sr_{0.49}Eu_{0.05})O \cdot SiO_2$ | (B-5) |
| $2(Ba_{0.59}Sr_{0.35}Eu_{0.06})O \cdot SiO_2$ | (B-6) |
| $2(Ba_{0.52}Sr_{0.40}Eu_{0.08})O \cdot SiO_2$ | (B-7) |
| $2(Ba_{0.85}Sr_{0.10}Eu_{0.05})O \cdot SiO_2$ | (B-8) |
| $2(Ba_{0.47}Sr_{0.50}Eu_{0.03})O \cdot SiO_2$ | (B-9) |
| $2(Ba_{0.54}Sr_{0.36}Eu_{0.10})O \cdot SiO_2$ | (B-10) |
| $2(Ba_{0.69}Sr_{0.25}Ca_{0.02}Eu_{0.04})O \cdot SiO_2$ | (B-11) |
| $2(Ba_{0.56}Sr_{0.38}Mg_{0.01}Eu_{0.05})O \cdot SiO_2$ | (B-12) |
| $2(Ba_{0.81}Sr_{0.13}Mg_{0.01}Ca_{0.01}Eu_{0.04})O \cdot SiO_2$ | (B-13) |

The second green phosphor is not limited to the examples described above, and may be a phosphor which is formed using another composition ratio which satisfies the above conditions of the other combinations of MI and the values f and g.

(C) Tetravalent Manganese-Doped Tetravalent Metal Salt Fluoride Phosphor

The tetravalent manganese-doped tetravalent metal salt fluoride phosphor is actually represented by the following general formula.

$$MII_2(MIII_{1-h}Mn_h)F_6 \qquad (C)$$

Hereinafter, tetravalent manganese-doped tetravalent metal salt fluoride phosphor will be referred to as a "first red phosphor".

In general formula (C), Mn represents manganese, and F represents fluorine. In general formula (C), MII indicates at least one species of alkaline metal element selected from Na, K, Rb, and Cs. From the perspective of brightness and stability of powder characteristics, it is preferable that MII is K. In general formula (C), MIII indicates at least one species of tetravalent metal element selected from Ge, Si, Sn, Ti, and Zr. From the perspective of brightness and stability of powder characteristics, it is preferable that MIII is Ti.

In general formula (C), the value of h representing the composition ratio (the concentration) of Mn is $0.001 \leq h \leq 0.1$. When the value of h is less than 0.001, there is a problem in that sufficient brightness may not be obtained, and when the value of h exceeds 0.1, there is a problem in that the brightness greatly decreases due to concentration quenching or the like, and thus, such ranges are not suitable as values of h. From the perspective of brightness and stability of powder characteristics, it is preferable that h is $0.005 \leq h \leq 0.5$.

As the first red phosphor, specifically, it is possible to exemplify phosphors which are formed at the composition of the following examples (C-1) to (C-10).

$$K_2(Ti_{0.99}Mn_{0.01})F_6 \quad (C-1)$$

$$K_2(Ti_{0.9}Mn_{0.1})F_6 \quad (C-2)$$

$$K_2(Ti_{0.999}Mn_{0.001})F_6 \quad (C-3)$$

$$Na_2(Zr_{0.98}Mn_{0.02})F_6 \quad (C-4)$$

$$Cs_2(Si_{0.95}Mn_{0.05})F_6 \quad (C-5)$$

$$Cs_2(Sn_{0.98}Mn_{0.02})F_6 \quad (C-6)$$

$$K_2(Ti_{0.88}Zr_{0.10}Mn_{0.02})F_6 \quad (C-7)$$

$$Na_2(Ti_{0.75}Sn_{0.20}Mn_{0.05})F_6 \quad (C-8)$$

$$Cs_2(Ge_{0.999}Mn_{0.001})F_6 \quad (C-9)$$

$$(K_{0.80}Na_{0.20})_2(Ti_{0.69}Ge_{0.30}Mn_{0.01})F_6 \quad (C-10)$$

The first red phosphor is not limited to the examples described above, and may be a phosphor which is formed using another composition ratio which satisfies the above conditions of the other combinations of MII and MIII, and the value h.

(D) Tetravalent Manganese-Doped Tetravalent Metal Salt Fluoride Phosphor

The tetravalent manganese-doped tetravalent metal salt fluoride phosphor is actually represented by the following general formula.

$$MIV(MIII_{1-h}Mn_h)F_6 \quad (D):$$

Hereinafter, the tetravalent manganese-doped tetravalent metal salt fluoride phosphor will be referred to as a "second red phosphor".

In general formula (D), Mn represents manganese, and F represents fluorine. In general formula (D), in the same manner as MIII in general formula (C) described above, MIII indicates at least one species of tetravalent metal element selected from Ge, Si, Sn, Ti, and Zr. From the similar reason, it is preferable that MIII is Ti. In general formula (D), MIV indicates at least one species of alkaline earth metal element selected from Mg, Ca, Sr, Ba, and Zn. From the perspective of brightness and stability of powder characteristics, it is preferable that MIV is Ca.

In general formula (D), in the same manner as h in general formula (C) described above, the value of h representing the composition ratio (the concentration) of Mn is $0.001 \leq h \leq 0.1$, and for the same reason, the value of h is preferably $0.005 \leq h \leq 0.5$.

As the second red phosphor, specifically, it is possible to exemplify phosphors which are formed at the composition of the following examples (D-1) to (D-4).

$$Zn(Ti_{0.98}Mn_{0.02})F_6 \quad (D-1)$$

$$Ba(Zr_{0.995}Mn_{0.005})F_6 \quad (D-2)$$

$$Ca(Ti_{0.995}Mn_{0.005})F_6 \quad (D-3)$$

$$Sr(Zr_{0.98}Mn_{0.02})F_6 \quad (D-4)$$

The second red phosphor is not limited to the examples described above, and may be a phosphor which is formed using another composition ratio which satisfies the above conditions of the other combinations of MIII and MIV, and the value h.

[Appendix]

It is desirable that the appearance of each of the LED chips used in the first to seventh embodiments is such that the shape of each of the LED chips is rectangular as viewed from the top surface side (the opposite direction from the Z direction). It is desirable that each of the LED chips is disposed on the substrate 12 or 52 such that the longitudinal direction of each of the LED chips is the same direction (the X direction) as the longitudinal direction of the substrate 12 or 52.

It is desirable that the appearance of the package which forms each of the LEDs used in the first to fourth, sixth, and seventh embodiments (excluding the application examples of the fifth embodiment to the sixth and seventh embodiments) is such that the shape of the package is rectangular as viewed from the top surface side (the opposite direction from the Z direction). It is desirable that the shape of a light source region (the region which is formed by the opening portion of the concave surface portion) which is formed by each light source (for example, the first light source LS1 or the second light source LS2) in the package is rectangular. It is desirable that each of the LEDs is disposed on the substrate 12 such that the longitudinal direction of the package or the light source region is the same direction (the X direction) as the longitudinal direction of the substrate 12. It is also desirable that the shape of the light source region is rectangular in the LED 53 which is used in the fifth embodiment, and that the longitudinal direction of the light source region is the same direction (the X direction) as the longitudinal direction of the substrate 52.

It is desirable that the appearance of each of the LEDs used in the first to fourth, sixth, and seventh embodiments (excluding the application examples of the fifth embodiment to the sixth and seventh embodiments) is such that the shape of each of the LEDs is rectangular as viewed from the top surface side (the opposite direction from the Z direction). It is desirable that each of the LEDs is disposed on the substrate 12 such that the longitudinal direction of each of the LEDs is the same direction (the X direction) as the longitudinal direction of the substrate 12.

Note that, as illustrated in FIGS. 18 (a) and 18 (b), in the fifth embodiment, description is given of the LED 53 in which the package includes three concave surface portions. With regard to the appearance of the package of the LED 53, the shape of the package as viewed from the top surface side (the opposite direction from the Z direction) is rectangular, and the longitudinal direction of the package is the same direction (the Y direction) as the short direction (the width direction) of the substrate 52; however, the configuration is not limited thereto. For example, the LED 53 may be disposed on the substrate 52 such that the longitudinal direction of the package is the same direction (the X direction) as the longitudinal direction of the substrate 52.

With regard to the appearance of the LED 53, the shape of the LED as viewed from the top surface side (the opposite direction from the Z direction) is rectangular, and the longitudinal direction of the LED 53 is the same direction (the Y direction) as the short direction of the substrate 52; however, the configuration is not limited thereto. For example, the LED 53 may be disposed on the substrate 52 such that the longitudinal direction of the LED 53 is the same direction (the X direction) as the longitudinal direction of the substrate 52.

[Summary]

An illumination device (11, 21, 31, 41, 51) according to a first aspect of the present invention is provided with a light guide plate (15, 54) and a light source unit (10, 20, 30, 40, 50) which includes a substrate (12, 52) and a plurality of LED chips (16, 25) disposed on the substrate, and which is disposed such that emitted light of the LED chips enters a light entrance portion of the light guide plate, in which the LED chips are disposed to form a plurality of rows on the substrate, and are disposed to line up in a direction orthogonally intersecting the rows between each of the rows.

In the configuration described above, in the light source unit, since the LED chips are lined up in a direction which orthogonally intersects the rows between each of the rows, the two light emission points are in the vicinity of each other. Accordingly, the color mixing properties of the emitted light from each of the LED chips are improved. The light amount of the light incident on the light guide plate increases according to the number of rows. Accordingly, it is possible to increase the light intensity which is obtained from the light guide plate.

Based on the illumination device according to the first aspect, it is preferable that, in the illumination device according to a second aspect of the present invention, the light source unit further includes a single package (23) in which two of the LED chips which are adjacent between each of the rows are stored.

In the configuration described above, since the LED chips are stored in the single package, it is possible to narrow the installation width of the LED containing the LED chips on the substrate. Accordingly, it is possible to narrow the width of the light entrance portion which is determined according to the installation width, and to form the light guide plate long and thin. In addition, the plurality of LED chips is installed on the substrate at once by installing one LED on the substrate. Accordingly, since the workload of assembling the LED into the substrate is reduced in comparison to the workload of a case in which the plurality of LEDs are individually assembled, it is possible to reduce the manufacturing cost of the illumination device.

Based on the illumination device according to the first or second aspect, it is preferable that, in the illumination device according to a third aspect of the present invention, the LED chips are optically isolated from each other, and luminescent colors thereof are identical.

In the configuration described above, it is possible to prevent the mutual absorption of the light between the LED chips from occurring. Accordingly, it is possible to suppress a reduction in the luminous efficiency of the illumination device.

Based on the illumination device according to the third aspect, it is preferable that, in the illumination device according to a fourth aspect of the present invention, the LED chips form an LED which emits white light by being combined with a phosphor.

In the configuration described above, it is possible to obtain various white lights depending on the types of phosphor which are combined with the LED chips.

Based on the illumination device according to any one of the first to third aspects, it is preferable that, in the illumination device according to a fifth aspect of the present invention, the LED chips which are adjacent between each of the rows are combined with a different phosphor for each of the rows.

In the configuration described above, it is possible to obtain light of different colors depending on the phosphors which are combined with the LED chips. Accordingly, it is possible to obtain light of the desired color by mixing colors of different light for each of the rows.

Based on the illumination device according to the fifth aspect, it is preferable that, in the illumination device according to a sixth aspect of the present invention, combinations of the LED chips and the phosphors emit light of two chromaticity points on a black-body radiation curve.

In the configuration described above, since light of an intermediate color of light of the chromaticities of two points on the black-body radiation curve is obtained, it is possible to obtain diverse white light by combining white light of different color temperatures.

Based on the illumination device according to the fifth aspect, it is preferable that, in the illumination device according to a seventh aspect of the present invention, the LED chips are disposed in two rows, and the LED chips which are adjacent between each of the rows are blue LED chips, where one of the LED chips is combined with a red phosphor, and other one of the LED chips is combined with a green phosphor.

In the configuration described above, since the absorption of the green light which does not contribute to the emission of the red light by the red phosphor does not occur due to combining the blue LED chips with the red phosphor and the blue phosphor individually, a reduction in the luminous efficiency does not occur.

Based on the illumination device according to the seventh aspect, it is preferable that, in the illumination device according to an eighth aspect of the present invention, one of the LED chips which are adjacent between each of the rows has a peak wavelength suitable for an optimal excitation wavelength of the red phosphor, and the other of the LED chips has a peak wavelength suitable for an optimal excitation wavelength of the green phosphor.

In the configuration described above, since the blue LED chips have peak wavelengths suitable for the optimal excitation wavelengths of the red phosphor and the blue phosphor with which the blue LED chips are combined, the red phosphor and the blue phosphor are excited at the optimal excitation wavelengths. Accordingly, since the loss of light emission by the red phosphor and the blue phosphor may be suppressed, it is possible to improve the luminous efficiency of the illumination device.

Based on the illumination device according to the first or second aspect, it is preferable that, in the illumination device according to a ninth aspect of the present invention, the LED chips are disposed in two rows, one of the LED chips which are adjacent between each of the rows is a green LED chip, and other of the LED chips is a blue LED chip, and the blue LED chip is combined with a red phosphor.

In the configuration described above, the chromaticity point of the green light which is emitted by the green LED chips is closer to the outside than the chromaticity coordinate of the chromaticity point of the green light which is emitted by the green phosphor (refer to FIG. 13). Accordingly, it is possible to increase the area of the triangle joining the three chromaticity points of red, blue, and green. The colors in a television image are reproduced by adjusting the light intensity of each of the colors on the inside of the triangle described above. Therefore, the larger the area of the triangle, the more the color reproduction property improves.

Based on the illumination device according to any of the first to third aspects, it is preferable that, in the illumination device according to a tenth aspect of the present invention, the LED chips are disposed in two rows, the LED chips are blue LED chips and are combined with a red phosphor and a green phosphor, combinations of two of the LED chips which are adjacent between each of the rows and the red phosphor and the green phosphor form each of a first light source and a second light source, the first light source emits white light of any chromaticity from incandescent which has a color temperature of 2400 K to daylight which has a color temperature of 7000 K, and the second light source emits light with a chromaticity within a range surrounded by, on an xy chromaticity diagram, in relation to point A (0.555, 0.394) and point B (0.419, 0.343), a first isotemperature line and a first isanomalous line in relation to a black-body radiation locus which pass through the point A, and a second isotemperature line and a second isanomalous line in relation to the black-body radiation locus which pass through the point B (0.419, 0.343).

In the configuration described above, light with a chromaticity point (x=0.347, y=0.259), that is, neutral white light is obtained using the first light source, and light with a chromaticity point (x=0.500, y=0.382), that is, orange pink light is obtained using the second light source. Accordingly, it is possible to obtain light of a color which is between the neutral white and the orange pink if the light intensities of the first light source and the second light source are adjusted appropriately.

Based on the illumination device according to any one of the first to third aspects, it is preferable that, in the illumination device according to an eleventh aspect of the present invention, the LED chips are disposed in two rows and are blue LED chips, one of the two LED chips which are adjacent between each of the rows, one of the LED chips has a peak wavelength of 415 nm to less than 460 nm and is combined with a red phosphor and a green phosphor, and other one of the LED chips has a peak wavelength of 460 nm to 500 nm and is not combined with the phosphors.

In the configuration described above, it is possible to efficiently excite the red phosphor and the green phosphor using blue light with a peak wavelength of 415 nm to less than 460 nm which is emitted from one row of the LED chips. Since the main blue component of the white light which is obtained using the illumination device is blue light with a peak wavelength of 460 nm to 500 nm which is emitted from the LED chips of the other row, it is possible to reduce blue light.

Based on the illumination device according to any one of the first to third aspects, it is preferable that, in the illumination device according to a twelfth aspect of the present invention, the LED chips are disposed in two rows and are blue LED chips, one of the two LED chips which are adjacent between each of the rows, one of the LED chips has a peak wavelength of 350 nm to 410 nm and is combined with a red phosphor and a green phosphor, and other one of the LED chips is not combined with the phosphors.

In the configuration described above, it is possible to efficiently emit red and green by using a red phosphor and a green phosphor which are efficiently excited by the output light of the LED chips which emit light with a peak wavelength of 350 nm to 410 nm. Most of the light energy which is output from the LED chips described above is consumed exciting the red phosphor and the green phosphor. When using the illumination device in a backlight of a liquid crystal display device, the overlap between the light emission spectra of the former LED chip and the green phosphor is reduced. Accordingly, since the color separation by the color filters of the liquid crystal display panel is improved, it is possible to enlarge the green color gamut. It is also possible to enlarge the total color gamut of blue, green, and red by selecting phosphors which have emission wavelengths which are approximately 1 to 5 nm short as the green phosphor.

Based on the illumination device according to any of the first to third aspects, it is preferable that, in the illumination device according to a thirteenth aspect of the present invention, the LED chips are disposed in two rows, the LED chips are blue LED chips and are combined with a red phosphor and a green phosphor, combinations of the two LED chips which are adjacent between each of the rows and the red phosphor and the green phosphor form each of a first light source and a second light source, the first light source contains a forbidden transition type phosphor material as the red phosphor, and the second light source contains an allowed transition type phosphor material as the red phosphor.

In the configuration described above, since the characteristics of the red phosphor in the first light source are different from the characteristics of the red phosphor in the second light source, it is possible to obtain light with different characteristics by controlling the light amounts of the first light source and the second light source according to conditions. Therefore, it is possible to use the illumination device favorably in a display device which performs display in which the color rendering properties are raised and display in which the persistence is reduced.

Based on the illumination device according to any of the first to third aspects, it is preferable that, in the illumination device according to a fourteenth aspect of the present invention, the LED chips are disposed in two rows, the LED chips are blue LED chips and are combined with a red phosphor and a green phosphor, combinations of the two LED chips which are adjacent between each of the rows and the red phosphor and the green phosphor form each of a first light source and a second light source, the first light source contains a forbidden transition type phosphor material as the red phosphor and the green phosphor, and the second light source contains an allowed transition type phosphor material as the red phosphor and the green phosphor.

In the configuration described above, in the same manner as the illumination device according to the thirteenth aspect, a phosphor material of a forbidden transition type which has a narrow spectrum with good color rendering properties but a slow reaction speed is used as the red phosphor of the first light source, and a phosphor material of an allowed transition type which has a fast reaction speed is used as the red phosphor of the second light source. In this manner, since the characteristics of the both of the red phosphors are different, it is possible to obtain light with different characteristics by controlling the light amounts of the first light source and the second light source according to conditions.

The green phosphor of the first light source is formed of a phosphor material with a slow reaction speed, and the green phosphor of the second light source is formed of a phosphor material with a fast reaction speed. Accordingly, the reaction speeds of the red phosphor and the green phosphor in the first light source have the same order level, and the reaction speeds of the red phosphor and the green phosphor in the second light source have the same order level. Therefore, when adjusting the light amount ratio of the first light source LS1 and the second light source LS2, it is possible to render balancing the persistence amounts between the phosphors easy.

Based on the illumination device according to the first or second aspect, it is preferable that, in the illumination device according to a fifteenth aspect of the present invention, an LED is formed by sealing the LED chips inside a package and the LED is installed on the substrate, and a light emitting surface of the LED is rectangular, and a longitudinal direction of the light emitting surface and a longitudinal direction of the substrate are same direction.

In the configuration described above, since the shape of the light emitting surface of the LED is rectangular and the longitudinal direction of the light emitting surface and the longitudinal direction of the substrate are the same direction, it is possible to line up the LEDs on the elongated substrate in the width direction of the substrate. According to this shape, the directional characteristics of the LEDs are wide in the long side direction of each of the light emitting surfaces of the LEDs, and the characteristics are narrow in the short side direction. Accordingly, since the light into the light entrance portion is incident constrained in relation to the width direction of the light entrance portion, the light entrance properties to the light guide plate are improved.

Based on the illumination device according to any one of the first to third aspects, it is preferable that, in the illumination device according to a sixteenth aspect of the present invention, three of the LED chips are lined up in a direction orthogonally intersecting the rows between each of the rows.

In the configuration described above, it is possible to obtain light of the desired color using color mixing when the luminescent colors of the three LED chips which line up in a direction orthogonally intersecting the rows between each of the rows. When the luminescent colors of the three LED chips are subjected to color mixing, it is possible to increase the light amount.

An illumination equipment according to an aspect of the present invention includes the illumination device of any one of the first to sixteenth aspects described above.

A display device according to an aspect of the present invention includes the illumination device of any one of the first to sixteenth aspects described above as a backlight.

The present invention is not limited to the embodiments described above, various modifications are possible within a range indicated in the claims, and embodiments which are obtained by combining, as appropriate, the technical means disclosed in each of the different embodiment are also contained in the technical scope of the present invention. It is possible to form new technical characteristics by combining the technical characteristics which are disclosed in each of the embodiments.

INDUSTRIAL APPLICABILITY

It is possible to use the present invention favorably in a liquid crystal display device or an illumination equipment by obtaining an improvement in the color mixing properties and an increase in the emitted light amount of LED light in a light guide plate.

REFERENCE SIGNS LIST

7 PACKAGE
10 LIGHT SOURCE UNIT
11 ILLUMINATION DEVICE
12 SUBSTRATE
13 LED
14 LED
15 LIGHT GUIDE PLATE
15a LIGHT ENTRANCE PORTION
16 LED CHIP
16A LED CHIP
16B LED CHIP (BLUE LED CHIP)
18 RED PHOSPHOR (RED PHOSPHOR)
19 PHOSPHOR (GREEN PHOSPHOR)
20 LIGHT SOURCE UNIT
21 ILLUMINATION DEVICE
22 LED
22A LED
22B LED
22C LED
22D LED
22E LED
22F LED
22G LED
22H LED
23 PACKAGE
23c PARTITION
24 PHOSPHOR (GREEN PHOSPHOR)
25 LED CHIP (GREEN LED CHIP)
31 ILLUMINATION DEVICE
32 LED
41 ILLUMINATION DEVICE
42 LED
50 LIGHT SOURCE UNIT
51 ILLUMINATION DEVICE
52 SUBSTRATE
53 LED
54 LIGHT GUIDE PLATE
54a LIGHT ENTRANCE PORTION
101 LIQUID CRYSTAL DISPLAY DEVICE (DISPLAY DEVICE)
103 BACKLIGHT (ILLUMINATION DEVICE)
103a LIGHT GUIDE PLATE
103b SUBSTRATE
103c LED
111 CEILING LIGHT (ILLUMINATION EQUIPMENT)
112 ILLUMINATION DEVICE
112a LIGHT GUIDE PLATE
112b SUBSTRATE
112c LED
LS1 FIRST LIGHT SOURCE
LS2 SECOND LIGHT SOURCE
V0 BLACK-BODY RADIATION LOCUS
S REGION
V1 ISANOMALOUS LINE (FIRST ISANOMALOUS LINE)
V2 ISANOMALOUS LINE (SECOND ISANOMALOUS LINE)
W1 ISOTEMPERATURE LINE (FIRST ISOTEMPERATURE LINE)
W2 ISOTEMPERATURE LINE (TWENTY FIRST ISOTEMPERATURE LINE)

The invention claimed is:

1. An illumination device, comprising:
a light guide plate; and
a light source unit which includes a substrate and a plurality of LED chips disposed on the substrate, and which is disposed such that emitted light of the LED chips enters a light entrance portion of the light guide plate,
wherein the LED chips are disposed to form a first row and a second row parallel to each other on the substrate, and are disposed to line up in an orthogonal direction orthogonally intersecting a direction of the first row and the second row, wherein the light source unit further includes a single package in which two of the LED chips which are adjacent in the orthogonal direction are stored,
wherein a shape of each of the LED chips an elongated rectangle, and a longitudinal direction of each of the LED chips and a longitudinal direction of the substrate are a same direction.

2. The illumination device according to claim 1, wherein the LED chips are optically isolated from each other, and luminescent colors thereof are the same.

3. The illumination device according to claim 2, wherein the LED chips form an LED which emits white light by being combined with a phosphor.

4. The illumination device according to claim 1, wherein the LED chips which are adjacent in the orthogonal direction are combined with a different phosphor for each of the first row and the second row.

5. The illumination device according to claim 4, wherein combinations of the LED chips and the phosphors emit light of two chromaticity points on a black-body radiation curve.

6. The illumination device according to claim 4,
wherein the LED chips which are adjacent in the orthogonal direction are blue LED chips, where one of the LED chips is combined with a red phosphor, and other one of the LED chips is combined with a green phosphor.

7. The illumination device according to claim 6,
wherein the one of the LED chips has a peak wavelength suitable for an optimal excitation wavelength of the red phosphor, and the other one of the LED chips has a peak wavelength suitable for an optimal excitation wavelength of the green phosphor.

8. The illumination device according to claim 1,
wherein one of the LED chips which are adjacent in the orthogonal direction is a green LED chip, and another one of the LED chips is a blue LED chip, and
wherein the blue LED chip is combined with a red phosphor.

9. The illumination device according to claim 1,
wherein the LED chips are blue LED chips and are combined with a red phosphor and a green phosphor,
wherein combinations of two of the LED chips which are adjacent in the orthogonal direction and the red phosphor and the green phosphor form each of a first light source and a second light source,
wherein the first light source emits white light of any chromaticity from incandescent which has a color temperature of 2400 K to daylight which has a color temperature of 7000 K, and
wherein the second light source emits light with a chromaticity within a range surrounded by, on an xy chromaticity diagram, in relation to point A (0.555, 0.394) and point B (0.419, 0.343), a first isotemperature line and a first isanomalous line in relation to a black-body radiation locus which pass through the point A, and a second isotemperature line and a second isanomalous line in relation to the black-body radiation locus which pass through the point B (0.419, 0.343).

10. The illumination device according to claim 1,
wherein the LED chips are blue LED chips,
wherein, one of the two LED chips which are adjacent in the orthogonal direction, one of the LED chips has a peak wavelength of 415 nm to less than 460 nm and is combined with a red phosphor and a green phosphor, and
wherein other one of the LED chips has a peak wavelength of 460 nm to 500 nm and is not combined with the phosphors.

11. The illumination device according to claim 1,
wherein the LED chips are blue LED chips,
wherein, one of the two LED chips which are adjacent in the orthogonal direction, one of the LED chips has a peak wavelength of 350 nm to 410 nm and is combined with a red phosphor and a green phosphor, and
wherein another one of the LED chips is not combined with the phosphors.

12. The illumination device according to claim 1,
wherein the LED chips are blue LED chips and are combined with a red phosphor and a green phosphor,
wherein combinations of the two LED chips which are adjacent in the orthogonal direction and the red phosphor and the green phosphor form each of a first light source and a second light source,
wherein the first light source contains a forbidden transition type phosphor material as the red phosphor, and
wherein the second light source contains an allowed transition type phosphor material as the red phosphor.

13. The illumination device according to claim 1,
wherein the LED chips are blue LED chips and are combined with a red phosphor and a green phosphor,
wherein combinations of the two LED chips which are adjacent in the orthogonal direction and the red phosphor and the green phosphor form each of a first light source and a second light source,
wherein the first light source contains a forbidden transition type phosphor material as the red phosphor and the green phosphor, and
wherein the second light source contains an allowed transition type phosphor material as the red phosphor and the green phosphor.

14. Illumination equipment comprising the illumination device according to claim 1.

15. A display device comprising the illumination device according to claim 1 is a backlight.

16. The illumination device according to claim 1,
wherein the package has a first concave portion, a second concave portion, and a partition provided between the first concave portion and the second concave portion,
wherein the partition is present between the first row and the second row,
wherein at least one of the LED chips forming the first row is provided in the first concave portion, and
wherein at least one of the LED chips forming the second row is provided in the second concave portion.

17. The illumination device according to claim 16, further comprising:
a first light source formed by sealing the at least one of LED chips in the first concave portion with resin; and
a second light source formed by sealing the at least one of LED chips in the second concave portion with resin,
wherein a light emitting surface of the first light source has a shape of either a rectangle or a rectangle with one corner portion cut out, and a longitudinal direction of the light emitting surface of the first light source and the longitudinal direction of the substrate are a same direction, and
wherein a light emitting surface of the second light source has a shape of either a rectangle or a rectangle with one corner portion cut out, and a longitudinal direction of the light emitting surface of the second light source and the longitudinal direction of the substrate are a same direction.

18. The illumination device according to claim 1,
wherein the package has a rectangular appearance, and
wherein a longitudinal direction of the package and the longitudinal direction of the substrate are a same direction.

19. An illumination device, comprising:
a light guide plate; and
a light source unit which includes a substrate and a plurality of LED chips disposed on the substrate, and which is disposed such that emitted light of the LED chips enters a light entrance portion of the light guide plate,
wherein the LED chips are disposed to form a first row, a second row, and a third row parallel to each other on the substrate, and are disposed to line up in an orthogonal direction orthogonally intersecting a direction of the first row, the second row, and the third row,
wherein the light source unit further includes a single package in which three of the LED chips which are adjacent in the orthogonal direction are stored, and
wherein a shape of each of the LED chips is an elongated rectangle, and a longitudinal direction of each of the LED chips and a longitudinal direction of the substrate are a same direction.

20. The illumination device according to claim 19,
wherein the package has a first concave portion, a second concave portion, a third concave portion, a first partition provided between the first concave portion and the second concave portion, and a second partition provided between the second concave portion and the third concave portion,
wherein the first partition is present between the first row and the second row,
wherein the second partition is present between the second row and the third row,
wherein at least one of LED chips forming the first row is provided in the first concave portion,
wherein at least one of LED chips forming the second row is provided in the second concave portion, and
wherein at least one of LED chips forming the third row is provided in the third concave portion.

21. The illumination device according to claim 20, further comprising:
a first light source formed by sealing the at least one of LED chips in the first concave portion with resin;
a second light source formed by sealing the at least one of LED chips in the second concave portion with resin; and
a third light source formed by sealing the at least one of LED chips in the third concave portion with resin,
wherein a light emitting surface of the first light source has a shape of either a rectangle or a rectangle with one corner portion cut out, and a longitudinal direction of the light emitting surface of the first light source and the longitudinal direction of the substrate are a same direction,
wherein a light emitting surface of the second light source has a shape of either a rectangle or a rectangle with one corner portion cut out, and a longitudinal direction of the light emitting surface of the second light source and the longitudinal direction of the substrate are a same direction, and
wherein a light emitting surface of the third light source has a shape of either a rectangle or a rectangle with one corner portion cut out, and a longitudinal direction of the light emitting surface of the third light source and the longitudinal direction of the substrate are a same direction.

* * * * *